(12) United States Patent
Kuribayashi et al.

(10) Patent No.: US 6,215,244 B1
(45) Date of Patent: Apr. 10, 2001

(54) STACKED ORGANIC LIGHT EMITTING DEVICE WITH SPECIFIC ELECTRODE ARRANGEMENT

(75) Inventors: Masaki Kuribayashi, Inagi; Yuichi Hashimoto; Akihiro Senoo, both of Tokyo; Kazunori Ueno, Ebina; Seiji Mashimo, Tokyo, all of (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/092,868

(22) Filed: Jun. 8, 1998

(30) Foreign Application Priority Data

Jun. 16, 1997 (JP) .................................................. 9-158762
Jun. 25, 1997 (JP) .................................................. 9-168773

(51) Int. Cl.⁷ .................................................. H01J 1/62
(52) U.S. Cl. .................................................. 313/505
(58) Field of Search .................................. 313/498, 499, 313/500, 501, 502, 503, 504, 505, 506, 512, 483

(56) References Cited

U.S. PATENT DOCUMENTS

| 5,721,160 | * | 2/1998 | Forrest et al. | 438/28 |
| 5,757,139 | * | 5/1998 | Forrest et al. | 315/169.3 |
| 5,874,803 | * | 2/1999 | Garbuzov et al. | 313/506 |
| 5,917,280 | * | 6/1999 | Burrows et al. | 313/506 |
| 5,932,895 | * | 8/1999 | Shen et al. | 257/89 |

FOREIGN PATENT DOCUMENTS

| 0 631 317 A2 | 12/1994 | (EP) . |
| 0 767 486 A2 | 4/1997 | (EP) . |
| 2 728 082 A1 | 12/1994 | (FR) . |
| 6-136360 | 5/1994 | (JP) . |
| 6-188074 | 7/1994 | (JP) . |
| 6-192654 | 7/1994 | (JP) . |
| 6-256759 | 9/1994 | (JP) . |
| 8-41452 | 2/1996 | (JP) . |
| 8-241048 | 9/1996 | (JP) . |

OTHER PUBLICATIONS

Patent Abstracts of Japan, vol. 1996, No. 122, Dec. 26, 1996 & JP 08 213645 A (Sony Corp), Aug. 20, 1996 & US 5 811 348 A (Matsushita Takeshi Et Al) Sep. 22, 1998.
Patent Abstracts of Japan, vol. 1996, No. ü, Jul. 31, 1996 & JP 08 070111 A (Canon Inc) Mar. 12, 1996.
Patent Abstracts of Japan, vol. 018, No. 077 (E–1504), Feb. 8, 1994 & JP 05 290972 A (Nichia Chem Ind Ltd), Nov. 5, 1993.

* cited by examiner

*Primary Examiner*—Nimeshkumar D. Patel
*Assistant Examiner*—Matthew J. Gerike
(74) *Attorney, Agent, or Firm*—Fitzpatrick, Cella, Harper & Scinto

(57) ABSTRACT

Provided is a method for producing an electroluminescence device, which comprises steps of making a surface of a crystal silicon substrate porous to form a porous silicon film, forming a first electroconductive film on the porous silicon film, forming an electroluminescence film on the first electroconductive film, forming a second electroconductive film on the electroluminescence film, peeling a laminate of the first electroconductive film, electroluminescence film, and second electroconductive film from the crystal silicon substrate, and mounting the laminate on a first base material.

32 Claims, 15 Drawing Sheets

○ : LIGHT EMITTING

● : NON-LIGHT EMITTING

STACKED ORGANIC LIGHT EMITTING DEVICE WITH SPECIFIC ELECTRODE ARRANGEMENT

BACKGROUND OF THE INVENTION

1. Field of the Invention

The present invention relates to an electroluminescence device, an electroluminescence apparatus, and production methods thereof and, more particularly, to an organic electroluminescence device and an organic electroluminescence apparatus that achieve light emission stable over the long period and with high luminance, and production methods thereof.

2. Related Background Art

The known organic electroluminescence members are, for example, those disclosed in Japanese Laid-open Patent Application Nos. 6-256759, 6-136360, 6-188074, 6-192654, and 8-41452.

It is also known that these organic electroluminescence members are driven by thin film transistors, for example, as described in Japanese Laid-open Patent Application No. 8-241048.

The emission luminance of the organic electroluminescence members was, however, not sufficient, when compared with CRT (catfode-ray tube) represented by a Braun tube.

In addition, the emission time is greatly decreased when the organic electroluminescence member is exposed to the atmosphere, particularly to the atmosphere containing even a small amount of water, during a film-forming step thereof. This was a great hindrance against practical use thereof.

Particularly, because emission of light of the three primary colors, red, green, and blue, was necessary for full-color display, three types of organic electroluminescence films for emitting the respective colors were prepared, and organic electroluminescence devices of a predetermined pattern were produced employing the photolithography process used in the process technology for production of color filters. Since the photolithography process had to be carried out in the atmosphere and since this process was often carried out under a wet condition, there was the problem that the patterning by the photolithography process was substantially not applicable to the organic electroluminescence materials.

It is thus the present status that the electroluminescence devices capable of emitting the three primary colors on a single substrate are not put in practical use yet.

SUMMARY OF THE INVENTION

An object of the present invention is to provide an electroluminescence device, solving the above problems, and particularly, a production method of the electroluminescence device.

Another object of the present invention is to provide a production method of electroluminescence device by which organic electroluminescence devices capable of emitting the three primary colors can be formed on a single substrate and by which continuously stable and high-luminance light emission is realized over the long period.

Still another object of the present invention is to provide a production method of organic electroluminescence device in which, for forming organic electroluminescence devices capable of emitting the three primary colors on a single substrate, the all steps can be carried out in vacuum, in a pressure-reduced space, or in a dry nitrogen atmosphere without exposure to the atmosphere.

Still another object of the present invention is to provide an electroluminescence device and an electroluminescence apparatus achieving high-luminance light emission, and production methods thereof.

Still another object of the present invention is to provide an electroluminescence device and an electroluminescence apparatus in which organic electroluminescence devices capable of emitting the three primary colors are formed on a single substrate and which achieve continuous, stable, high-luminance light emission over the long period, and production methods thereof.

Still another object of the present invention is to provide an organic electroluminescence device and an organic electroluminescence apparatus produced in such a way that, for forming organic electroluminescence devices capable of emitting the three primary colors on a single substrate, the all steps can be carried out in vacuum, a pressure-reduced space, or in a dry nitrogen atmosphere without exposure to the atmosphere, and production methods thereof.

First, the present invention has the first feature of a production method of electroluminescence device comprising steps of: making a surface of a crystal silicon substrate porous to form a porous silicon film; forming a first electroconductive film on the porous silicon film; forming an electroluminescence film on the first electroconductive film; forming a second electroconductive film on the electroluminescence film; peeling a laminate of the first electroconductive layer, the electroluminescence film, and the second electroconductive film from the crystal silicon substrate; and mounting the laminate on a first base material.

Second, the present invention has the second feature of a production method of electroluminescence device comprising steps of: making a surface of a crystal silicon substrate porous to form a porous silicon film; forming a first electroconductive film on the porous silicon film; forming an electroluminescence film on the first electroconductive film; forming a second electroconductive film on the electroluminescence film; peeling a laminate of the first electroconductive layer, the electroluminescence film, and the second electroconductive film from the crystal silicon substrate; mounting the laminate on a first base material; and then repeating the all foregoing steps one or more times except for using an electroluminescence film of a different kind from the first mentioned electroluminescence film.

Third, the present invention has the third feature of a production method of electroluminescence device comprising steps of: forming a first electroconductive film on a first base material (for example, a single crystal silicon substrate, a single crystal silicon substrate having a polycrystal silicon film on a surface thereof, or the like) having a peeling layer (for example, a porous silicon film or the like) so as to keep the first electroconductive film in a close-fit with the peeling layer; forming an electroluminescence film on the first electroconductive film; forming a second electroconductive film on the electroluminescence film; peeling a laminate of the first electroconductive film, the electroluminescence film, and the second electroconductive film from the first base material; and bonding the laminate onto a second base material prepared separately.

Fourth, the present invention has the fourth feature of an electroluminescence device comprising: a first electroluminescence member having a first anode, a first cathode, and a first electroluminescence material interposed between the first anode and first cathode; and a second electroluminescence member having a second anode overlaid on the first electroluminescence member, a second cathode, and a second electroluminescence material interposed between the second anode and second cathode, wherein the first anode and second anode are connected to each other and wherein the first cathode and second cathode are connected to each other.

Fifth, the present invention has the fifth feature of an electroluminescence device comprising: a first electroluminescence member having a first electrode, a first electroluminescence material connected to the first electrode, and a second electrode connected to the first electroluminescence material; and a second electroluminescence member having a third electrode overlaid on the second electrode of the first electroluminescence member with an insulating layer in between, a second electroluminescence material connected to the third electrode, and a fourth electrode connected to the second electroluminescence material, wherein the first electrode and the third electrode are connected to each other and the second electrode and the fourth electrode are connected to each other, and wherein the first electrode and the fourth electrode are insulated from each other and the second electrode and the third electrode are insulated from each other.

Sixth, the present invention has the sixth feature of an electroluminescence apparatus comprising electroluminescence devices arranged along plural rows and plural columns, each the electroluminescence device comprising a first electroluminescence member having a first electrode, a first electroluminescence material connected to the first electrode, and a second electrode connected to the first electroluminescence material; and a second electroluminescence member having a third electrode overlaid on the second electrode of the first electroluminescence member with an insulating layer in between, a second electroluminescence material connected to the third electrode, and a fourth electrode connected to the second electroluminescence material, the electroluminescence devices having such a device structure that the first electrode and the third electrode are connected to each other and the second electrode and fourth electrode are connected to each other and that the first electrode and the fourth electrode are insulated from each other and the second electrode and the third electrode are insulated from each other, the electroluminescence apparatus comprising first wires, each first wire being a common wire for connecting the first electrodes of the electroluminescence devices on one of the rows, and first driving means for driving the first wires, the apparatus further comprising second wires, each second wire being a common wire for connecting the fourth electrodes of the electroluminescence devices on one of the columns, and second driving means for driving the second wires.

Seventh, the present invention has the seventh feature of an electroluminescence apparatus comprising electroluminescence devices arranged along plural rows and plural columns, switching devices connected to the respective electroluminescence devices, gate wires, each gate wire being a common wire for connecting gates of switching devices on a row, and source wires, each source wire being a common wire for connecting sources of switching devices on a column, each the electroluminescence device comprising a first electroluminescence member having a first electrode, a first electroluminescence material connected to the first electrode, and a second electrode connected to the first electroluminescence material; and a second electroluminescence member having a third electrode overlaid on the second electrode of the first electroluminescence member with an insulating layer in between, a second electroluminescence material connected to the third electrode, and a fourth electrode connected to the second electroluminescence material, the electroluminescence devices having such a device structure that the first electrode and third electrode are connected to each other and the second electrode and the fourth electrode are connected to each other and that the first electrode and the fourth electrode are insulated from each other and the second electrode and the third electrode are insulated from each other, the electroluminescence apparatus further comprising a common wire for connecting the first electrode of the electroluminescence device to each drain of the switching device and for connecting the fourth electrodes of the electroluminescence devices in common.

Eighth, the present invention has the eighth feature of a production method of electroluminescence device comprising: a first step of making a surface of a first crystal silicon substrate porous to form a first porous silicon film, forming a first electroconductive film on the first porous silicon film, forming a first electroluminescence film on the first electroconductive film, and forming a second electroconductive film on the first electroluminescence film; a second step of making a surface of a second crystal silicon substrate porous to form a second porous silicon film, forming a third electroconductive film on the second porous silicon film, forming a second electroluminescence film on the third electroconductive film, and forming a fourth electroconductive film on the second electroluminescence film; a third step of overlaying the second electroconductive film of the first crystal silicon substrate, produced in the first step and the second step, on the fourth electroconductive film of the second crystal silicon substrate with an insulator in between, connecting the first electroconductive film to the third electroconductive film, and connecting the second electroconductive film to the fourth electroconductive film; a fourth step of peeling a laminate of the first electroconductive layer, the first electroluminescence film, the second electroconductive film, the third electroconductive film, the second electroluminescence film, and the fourth electroconductive film from the first or second crystal silicon substrate; and a fifth step of bonding the laminate onto a first base material.

DETAILED DESCRIPTION OF THE PREFERRED EMBODIMENTS

The present invention will be described according to examples thereof. In the present specification electroluminescence will be denoted by "EL."

EXAMPLE 1

Figure 1:
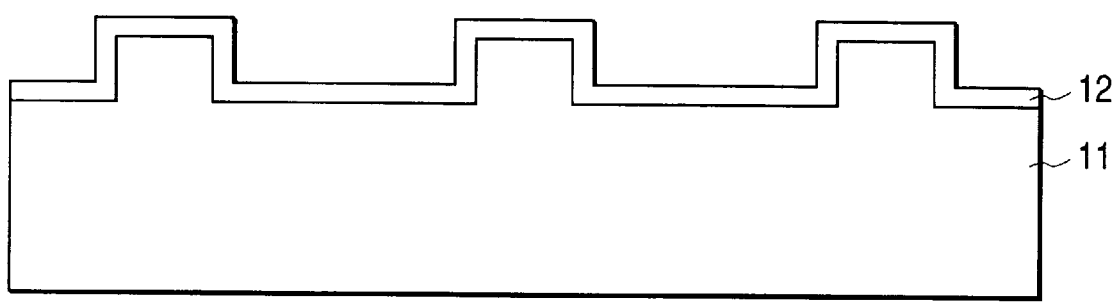
FIG. 1 is a sectional view of a single-crystal silicon substrate with a porous silicon film formed thereon, used in the present invention.

In a production method of EL device according to this example, a porous Si layer 12 was first formed by anodization (anodic oxidation) of single-crystal Si (silicon) substrate 11 having an uneven surface, as shown in FIG. 1. This method for forming the porous Si layer 12 by the anodizing process is well known (for example, OYO BUTURI, Vol. 57, No. 11, p 1710 (1988)). For example, in the case where the current density is 30 mA and an anodizing solution is $HF:H_2O:C_2H_5OH=1:1:1$, the thickness of the porous Si layer obtained is 5 to 50 $\mu$m and the porosity thereof is 10–50%. From the viewpoint of repetitive use of the single-crystal Si substrate 11, the thickness of this porous Si layer 12 is desirably as thin as possible, in order to reduce decrease in the thickness of this single-crystal Si substrate 11 and in turn increase the number of applicable times; the thickness is preferably 5–15 $\mu$m. For example, the thickness of the porous Si layer 12 is determined to be about 10 $\mu$m. The single-crystal Si substrate 11 is desirably of the p-type from the viewpoint that the porous Si layer 12 is formed thereon by anodization; however, the porous Si layer 12 can also be formed even on the substrate of the n-type, depending upon condition setting.

The surface unevenness of the single-crystal Si substrate 11 is made, for example, corresponding to the size and density of pixels in application to the EL display. In the case of application to the color EL devices, the pitch of projections is set three times longer.

The height of the projections is set to a value greater than the value of the thickness of the porous Si layer 12, preferably about 2 to 20 times greater.

Figure 2:
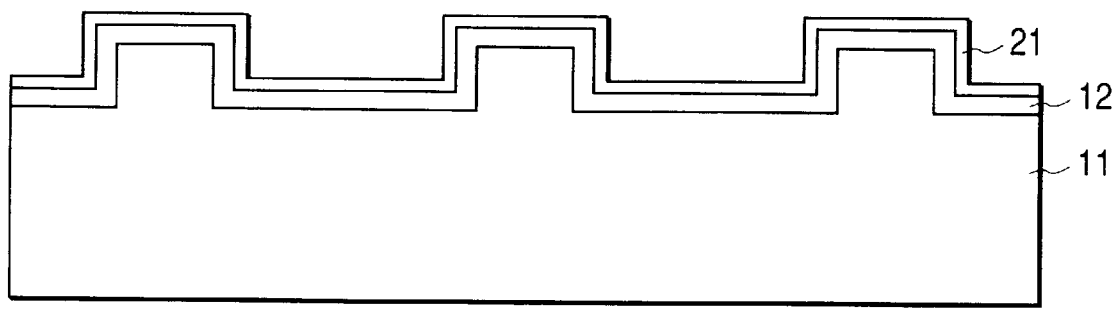
FIG. 2 is a sectional view to illustrate a state where an ITO film of transparent electrode is placed on the substrate shown in FIG. 1.

Next, an ITO film 21 of FIG. 2 was deposited in the thickness of 10 nm on the porous Si layer 12 of FIG. 1 by evaporation.

Figure 3:
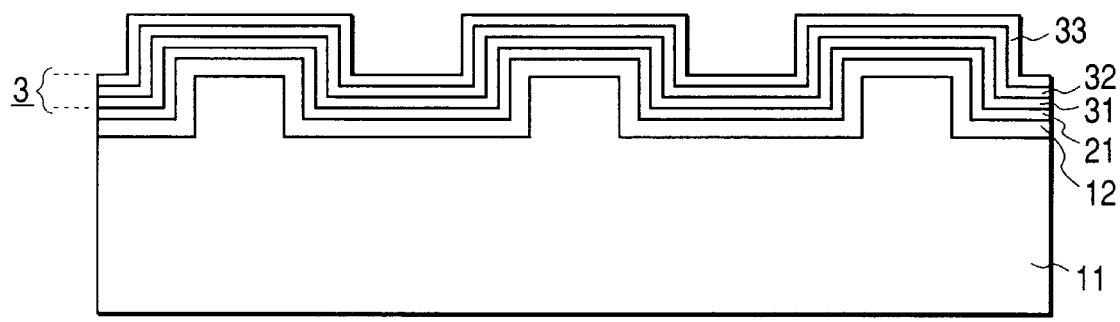
FIG. 3 is a sectional view to illustrate a state where an EL film is placed on the ITO film shown in FIG. 2.

Then the Si substrate with this ITO film 21 was fixed on a substrate holder of a commercially available evaporation system (available from ULVAC JAPAN, Ltd.), 200 mg of N, N'-bis (3-methylphenyl)-N, N'-diphenyl [1, 1'-biphenyl]-4-4'-diamine (TPD) was put on a resistance-heating boat of molybdenum, 200 mg of 4, 4'-bis (2, 2'-diphenylvinyl) biphenyl (DPVBi) was put on another molybdenum boat, and a vacuum chamber was evacuated to the pressure of $1\times10^{-4}$ Pa. After that, the above boat with TPD thereon was heated to 215–220° C. to evaporate TPD at the evaporation rate of 0.1–0.3 nm/s on the Si substrate, thereby depositing a hole injection layer 31 in the thickness of 60 nm as shown in FIG. 3. Without taking this out of the vacuum chamber, DPVBi was evaporated from the other boat to deposit a light emitting layer 32 in the thickness of 40 nm on the hole injection layer 31. The evaporation conditions were as follows; the temperature of the boat was 240° C., the evaporation rate was 0.1–0.3 nm/s, and the temperature of the substrate was room temperature. This was taken out of the vacuum chamber and a mask of stainless steel was mounted on the light emitting layer. Then the substrate was again set on the substrate holder. Then 200 mg of tris (8-quinolinol) aluminum ($Alq_3$) was put on the molybdenum boat and the boat was set in the vacuum chamber. Further, 1 g of magnesium ribbon was put on the resistance-heating boat of molybdenum and 500 mg of silver wire on another basket of tungsten. Then evaporation was conducted. Thereafter, the vacuum chamber was evacuated down to $1\times10^{-4}$ Pa and the boat with $Alq_3$ was heated up to 230° C., thereby evaporating an $Alq_3$ layer 33 at the evaporation rate of 0.01–0.03 nm/s up to the thickness of 20 nm.

As a result, a laminate of the hole injection layer 31, light emitting layer 32, and $Alq_3$ layer 33 forming the EL layer 3 was formed on the ITO film 21 of transparent electrode on the porous Si layer 12.

Further, silver was evaporated at the evaporation rate of 0.01 nm/s, and at the same time as it, magnesium was evaporated at the evaporation rate of 1.4 nm/s from the other molybdenum boat, by the resistance heating method. An electrode of mixed metals of magnesium and silver was evaporated in the thickness of 150 nm on the EL layer 3 under the above conditions, thus forming a counter electrode layer 41 of FIG. 4. This device was subjected to aging in dry nitrogen while applying voltages thereto at intervals of 0.5 V for 5 seconds each from 0 V to 10 V and from 0 V to –10 V.

Figure 5:
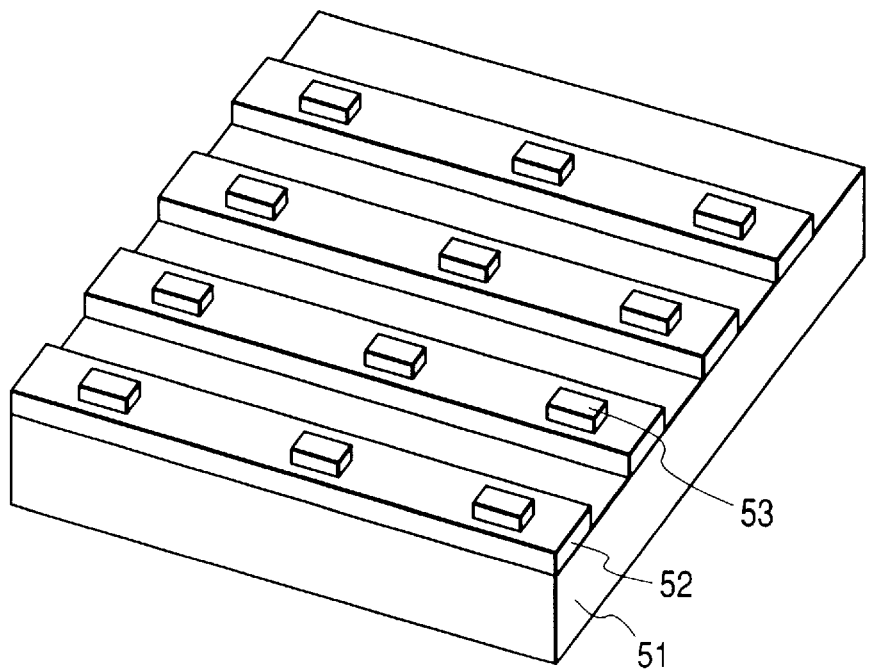
FIG. 5 is a perspective view to illustrate an example of a bonded substrate.

Then a bonded substrate 51 shown in FIG. 5 was held in a dry nitrogen chamber. On this occasion, electrodes 52 of a metal (silver, aluminum, gold, platinum, copper, or the like) were preliminarily placed in stripe patterns on the substrate 51 in correspondence to positions of the projections produced as described above, and adhesive electric connection members 53, which were of a thermosetting electroconductive adhesive or an ultraviolet or electron beam curable electroconductive adhesive, were further placed at the same pitch as that of the projections described above, on the stripes of metal electrodes 52.

The adhesive electric connection members 53 are obtained by using an electrically conductive adhesive in which electrically conductive particles such as carbon particles, silver particles, or copper particles are dispersed in an epoxy-based or phenol-based thermosetting adhesive or an ultraviolet or electron beam curable adhesive, applying the adhesive onto the striped metal electrodes 52 by a screen printing method, an offset printing method, or a dispenser applying method, and drying it.

The electrically conductive adhesive described above may contain a silane coupling agent such as N-(2-aminoethyl)-3-aminopropylmethyldimethoxysilane, N-(2-aminoethyl)-3-aminopropyltrimethoxysilane, 3-aminopropyltrimethoxysilane, 3-aminopropylmethyldiethoxysilane, or 3-glycidoxypropyltrimethoxysilane, for enhancing interfacial adhesive strength.

Figure 4:
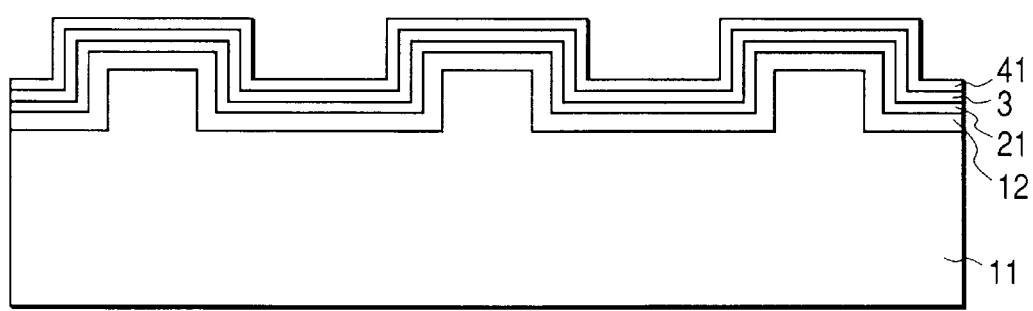
FIG. 4 is a sectional view to illustrate a state where a counter electrode layer is deposited on the EL film shown in FIG. 3.

Then the single-crystal Si substrate 11 produced in FIG. 4 was transferred from the vacuum chamber into the dry nitrogen chamber in which the bonded substrate 51 described above was set, and was held at a predetermined position in the dry nitrogen chamber.

Then the substrate 11 was fixed on an arm preliminarily mounted in the dry nitrogen chamber, and the arm was moved up to a position to face the bonded substrate 51 produced in FIG. 5 so that the counter electrodes 41 on the single-crystal Si substrate 11 were located opposite to the adhesive electric connection members 53 on the bonded substrate 51. Then the Si substrate 11 and the bonded substrate 51 were overlaid in a close fit on each other.

Then adhesion between the two substrates 11 and 51 was conducted through the adhesive electric connection members 53 under predetermined conditions (by application of heat or by exposure to ultraviolet rays or an electron beam).

Then stresses were imparted on the both substrates 11 and 51 in parallel to each other so as to peel the two bonded substrates 11 and 51 from each other at the border of the porous Si film 12. As a result, the two substrates 11 and 51 were peeled from each other through the porous Si film 12, whereby the laminate of the counter electrode layer 41, EL layer 3, and transparent electrode ITO film 21 was transferred onto the adhesive electric connection members 53 of the bonded substrate 51. On this occasion, it is preferred to perform such a pre-operation as to facilitate the peeling step, for example, by driving a wedge into the porous Si film 12 before the peeling.

Thereafter, the bonded substrate 51 after the peeling was carried into a mechanical polishing chamber filled with dry nitrogen, and the porous Si film remaining on the transparent electrode ITO film 21 after the peeling was removed by a mechanical polishing machine with polishing cloth on a pad.

Figure 6:
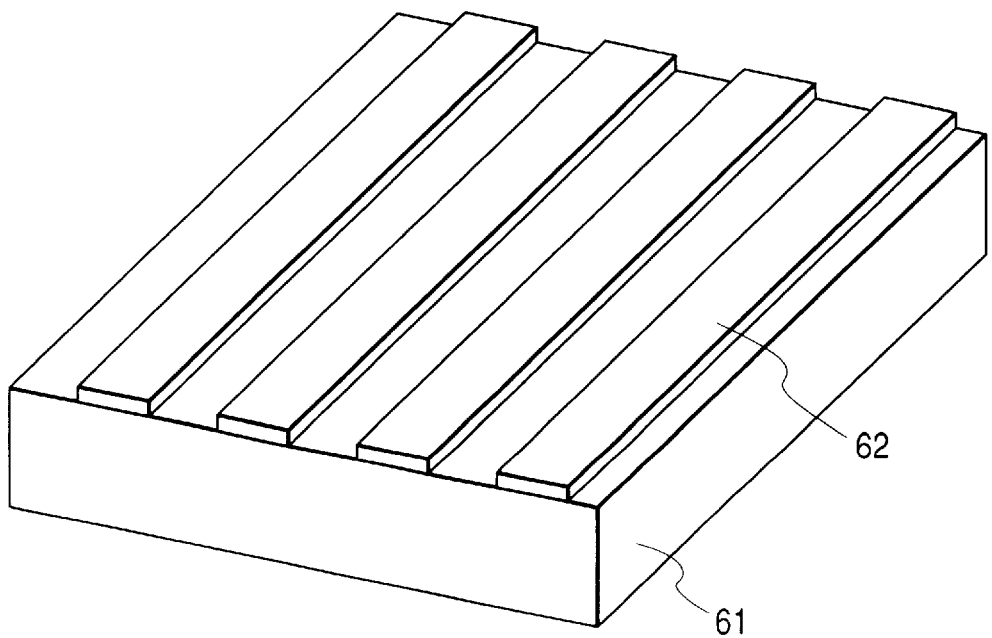
FIG. 6 is a perspective view to illustrate an example of a bonded substrate used as an opposite substrate.

Then another opposite bonded substrate 61 illustrated in FIG. 6 was set in the dry nitrogen chamber. This opposite bonded substrate 61 was preliminarily provided with such stripes of ITO film as to intersect with the longitudinal direction of the stripes of the aforementioned striped metal film 52, at positions where the positions of the polished, transparent electrode ITO films 21 on the bonded substrate 51 after the peeling were opposed.

Further, an epoxy-based adhesive or a phenol-based adhesive as a sealing adhesive was preliminarily applied around the opposite bonded substrate 61 by the screen printing method or the dispenser applying method.

The bonded substrate 61 provided with the EL layer 3, produced in the previous step, was carried into this dry nitrogen chamber, and the two bonded substrates 51 and 61 were overlaid on each other by predetermined arm operation so that the stripes of ITO film 62 were opposed to the transparent electrodes of ITO film 21 transferred on the bonded substrate 51. Then the two substrates 51 and 61 were kept under heat and pressure to be sealed and bonded by the sealing adhesive.

EXAMPLE 2

An EL apparatus for passive matrix drive was produced by the same method as in Example 1 except that a single-crystal Si substrate with a smooth surface replaced the single-crystal Si substrate with the uneven surface used in Example 1 and that the porous film was formed by placing a mask covering only positions corresponding to the depressions during the anodization for formation of porous Si film and anodizing only the positions corresponding to the projections.

The apparatus produced in this example achieved continuous high-luminance emission over the period of 20 or more days to show good EL emission display of moving picture.

EXAMPLE 3

An EL apparatus for passive matrix drive was produced according to the same method as in Example 1 except that the single-crystal Si substrate used in Example 1 was replaced by a substrate in which a polycrystal Si film was formed on an insulating film of $SiO_2$ on a surface of a single-crystal Si substrate.

The apparatus produced in this example showed good EL emission display of moving picture based on continuous high-luminance emission over the period of 20 or more days.

EXAMPLE 4

An EL apparatus for passive matrix drive provided with three-primary color emitting EL devices, REL, GEL, and BEL, was produced by setting the pitch of the projections of the uneven single-crystal Si substrate used in Eample 1 three times longer, and repeating the steps of Eample 1 three times, using the EL material for emission of red light (REL), the EL material for emission of green light (GEL), and the EL material for emission of blue light (BEL).

The apparatus produced in this example was driven to show display of moving picture by full-color EL emission, and it achieved continuous high-luminance display over the period of 20 or more days.

EXAMPLE 5

The same substrate as the single-crystal Si substrate illustrated in FIG. 4 in Eample 1 was produced and was carried into the dry nitrogen chamber by the arm. A bonded substrate 111 illustrated in FIG. 11 was preliminarily set in the chamber.

Figure 12:
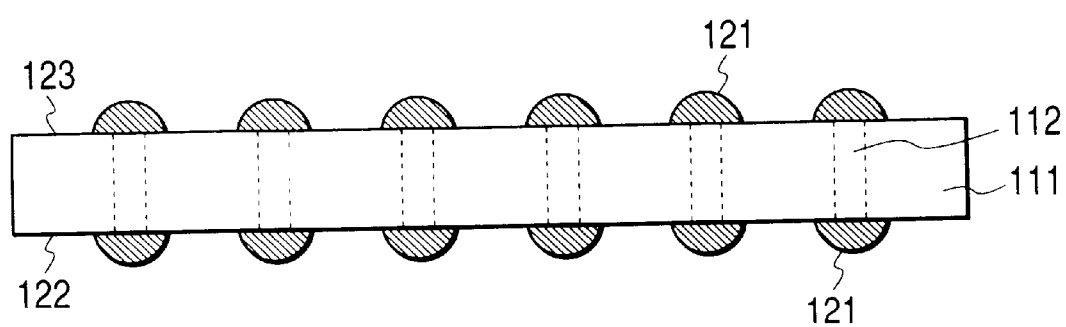
FIG. 12 is a sectional view of the bonded substrate shown in FIG. 11.

This bonded substrate 111 had through holes 112 at the positions corresponding to the projections of the single-crystal Si substrate. Each of these through holes 112 was charged with an electrically conductive paste agent 121, which became the adhesive electric connection members, in a heap as illustrated in FIG. 12 on the top and bottom sides.

This bonded substrate 111 was overlaid on the single-crystal Si substrate illustrated in FIG. 4 so that the through holes 121 and counter electrodes 41 were opposed to each other, and the two substrates were kept under pressure and heat.

Then the bonded substrate 111 was peeled through the porous Si film 12 on the single-crystal Si substrate 11, whereby the laminate of the transparent electrode ITO film 21, EL layer 3, and counter electrode layer 41 was transferred to the side of the bonded substrate 111.

Then an adhesive electric connection member 131 was placed on each drain electrode pad in a TFT substrate of FIG. 13 to FIG. 16 mounted in the same dry nitrogen chamber. The bonded substrate 111 and TFT substrate were overlaid on each other so that the adhesive electric connection members 131 on this TFT substrate and the conductive paste heaps 121 on the bottom surface 122 of the aforementioned bonded substrate 111 were opposed to each other, and the two substrates were kept under pressure and heat, thereby fixing the two substrates through the conductive electric connection members 131.

Then the same substrate as the bonded substrate 61 illustrated in FIG. 6 was also set in the same chamber. Sealing adhesive 117 was applied around this bonded substrate 61, and the two substrates were overlaid on each other so that the striped ITO film 62 on this bonded substrate 61 and the transparent electrode ITO film 21 of the laminate transferred to the top surface 123 side of the bonded substrate 111 bonded to the TFT substrate were opposed to each other. Then the two substrates were kept under pressure and heat to be fixed and sealed.

Figure 13:
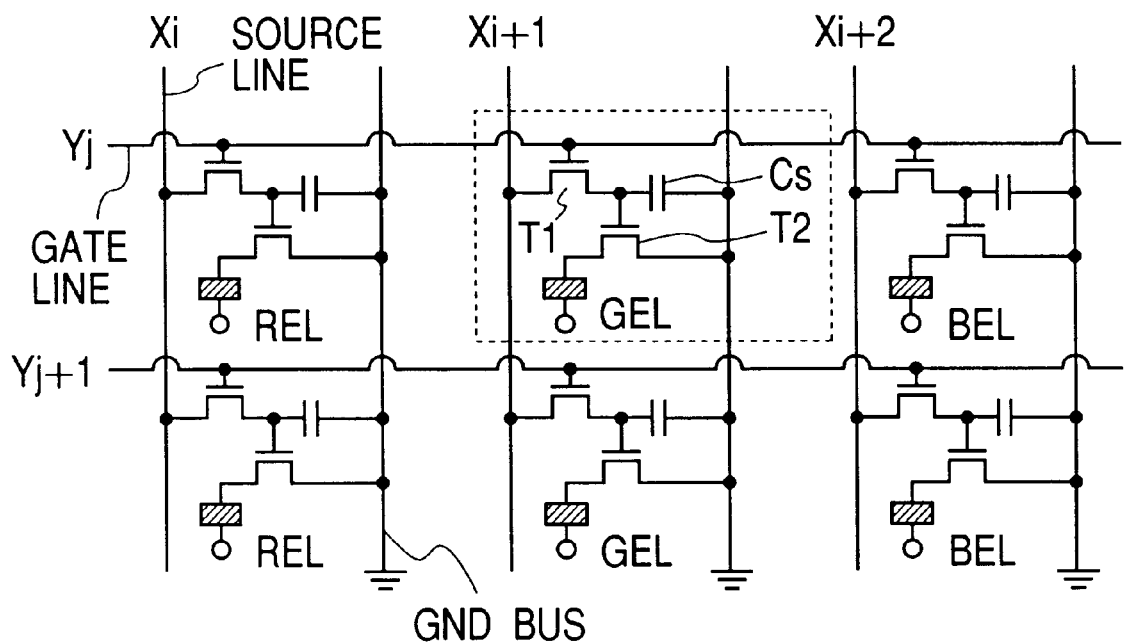
FIG. 13 is an equivalent circuit diagram of an EL apparatus for active matrix used in the present invention.

FIG. 13 is a schematic diagram of active matrix four-terminal TFT-EL devices. A device of each pixel includes two TFTs, a storage capacitor, and an EL device. A principal feature of the four-terminal type is the capability of separating an addressing signal from an EL excitation signal. The EL device is selected through the logic TFT (T1) and excitation power to the EL device is controlled by the power TFT (T2). The storage capacitor makes it possible to keep the excitation power staying in the addressed EL device once selected. Thus the circuit permits the EL device to operate at the duty cycle close to 100%, ignoring the time assigned to addressing.

Gate lines $Y_j$, $Y_{j+1}$, are preferably a lot of wires, for example 640 wires or 1120 wires, to which gate pulses are applied in order. The gate pulses may be of either interlace scanning or non-interlace scanning.

Source lines $X_i$, $X_{i+1}$, $X_{i+2}$ are preferably a lot of wires, for example 840 wires or 1280 wires, to which information signal pulses of a voltage set according to image data are applied in synchronism with the gate pulses.

In the drawing REL designates red-emitting EL, GEL green-emitting EL, and BEL blue-emitting EL; information signal pulses of red are applied to the source line $X_i$, green information pulses to $X_{i+1}$, and blue information pulses to $X_{i+2}$. This achieves the full-color display.

Figure 14:
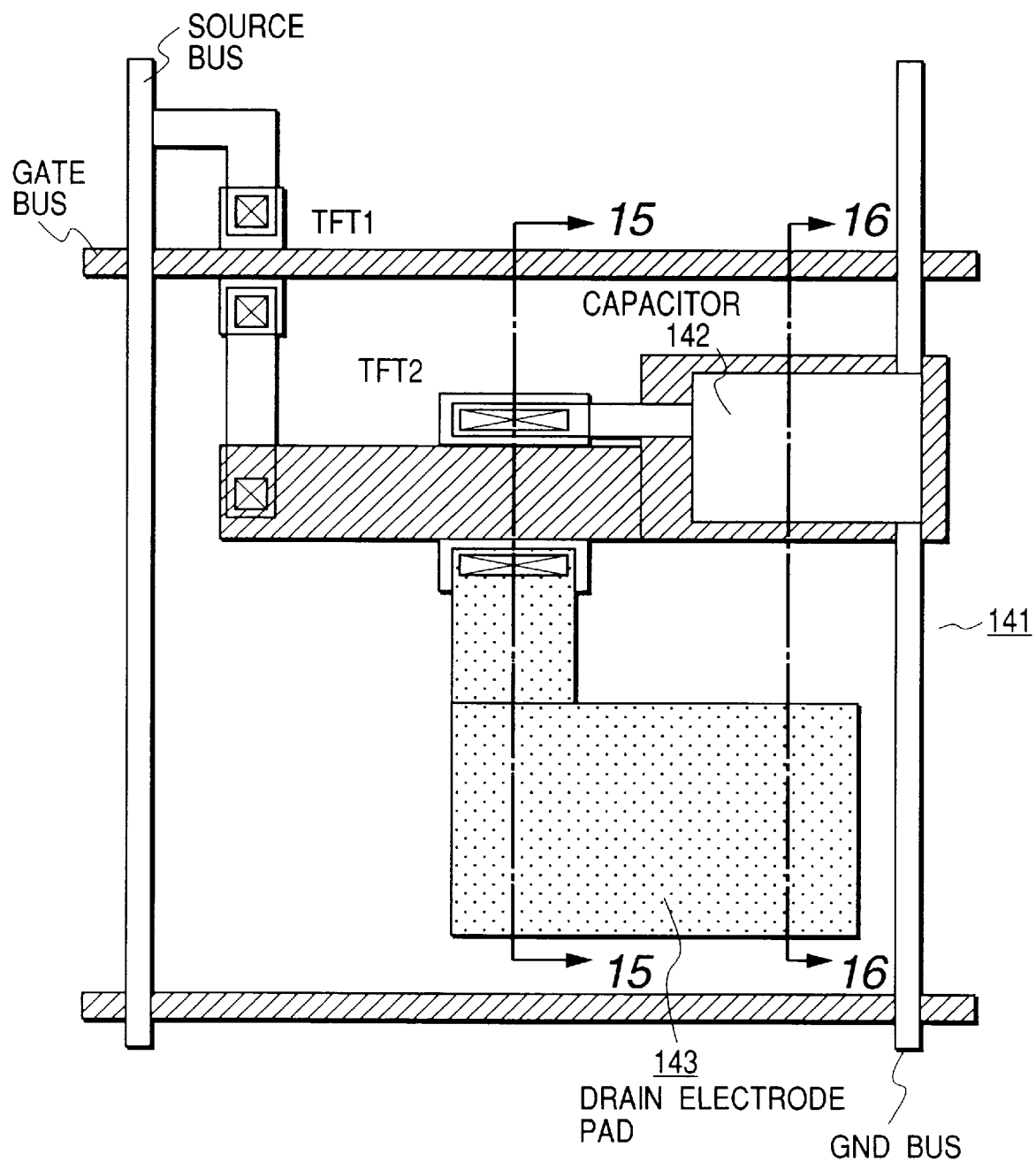
FIG. 14 is a plan view of a TFT substrate used in the present invention.

FIG. 14 is a plan view to show a typical example of TFT substrate 141 according to the present invention. TFT 1 corresponds to T1 of FIG. 13, TFT 2 to T2 of FIG. 13, capacitor 142 to Cs of FIG. 13, and drain electrode pad 143 to an electrode connected to the drain of T2 in each EL of FIG. 13.

Figure 15:
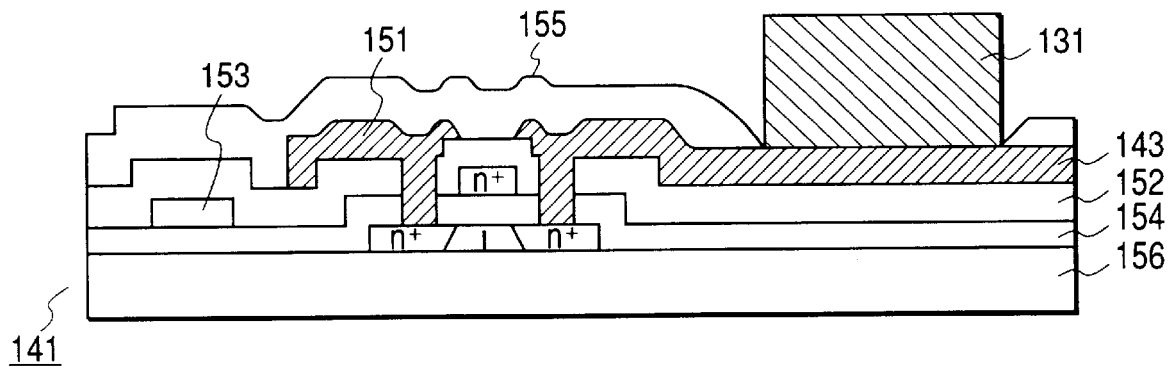
FIG. 15 is a sectional view along line A–A' of FIG. 14.
Figure 16:
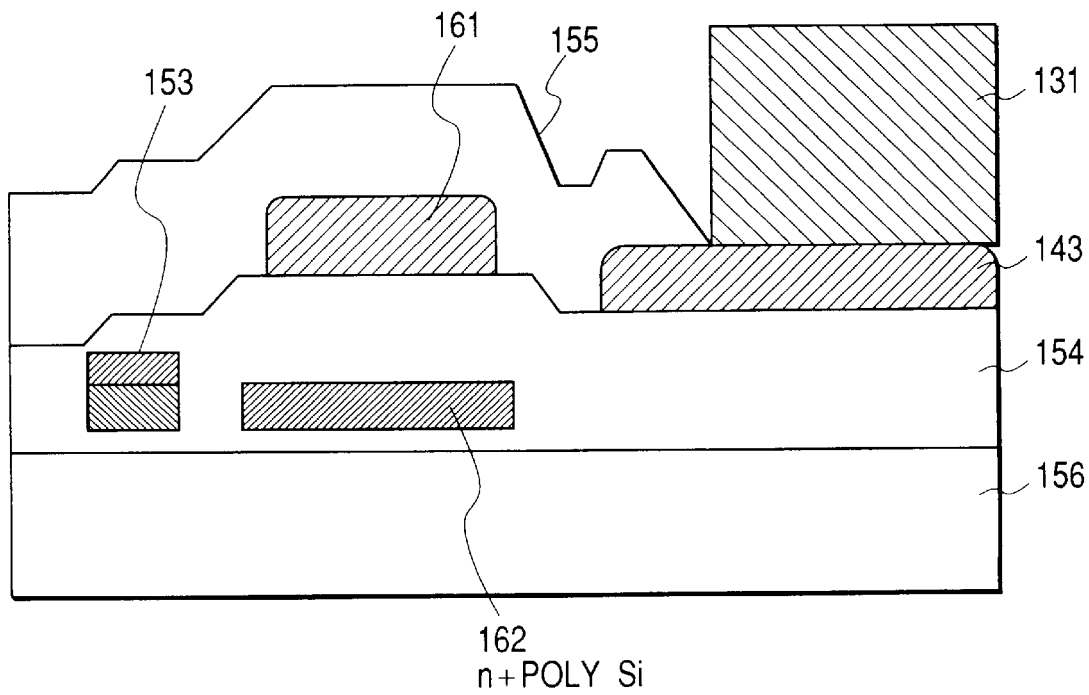
FIG. 16 is a sectional view along line B–B' of FIG. 14.

FIG. 15 is a sectional view along line 15—15 of FIG. 14.
FIG. 16 is a sectional view along line 16—16 of FIG. 14.

TFT 1 and TFT 2 used in the present invention have such transistor structure that source bus 151 on glass substrate 156 is connected to $n^+$ polysilicon, the drain to $n^+$ polysilicon, PECVD (plasma-enhanced CVD) 152-$SiO_2$ film 154 are placed as a gate insulating film on either side of the i-type polysilicon film, and the gate bus 153 is connected to $n^+$ polysilicon. Further, passivation film 155 is so arranged as to cover the portions except for the connection portion of the drain electrode pad 143.

The present invention is not limited to the aforementioned transistor structure, but may adopt either the stagger structure or the coplanar structure using amorphous silicon or microcrystalline silicon semiconductors.

The present invention can be applied to MOS transistors of the SOI (silicon on insulator) structure using crystal silicon.

The capacitor Cs is composed of a pair of capacitor electrodes 161 and 162, and $SiO_2$ film 154 interposed between the pair of capacitor electrodes as shown in FIG. 16. The capacitor electrode 161 is a film formed of Al or the like and connected to the ground bus, while the capacitor electrode 162 is a film formed of $n^+$ polysilicon and connected to the drain of TFT 2.

The gate bus 153 and source bus 151 are preferably chromium/aluminum layered wires.

The passivation film 155 is preferably a film of silicon nitride formed by plasma CVD.

A metal film of aluminum, silver, or the like can be used as the drain electrode pad 143 in order to provide it with reflecting performance, but a transparent conductive film such as ITO or ZnO may also be applied.

Figure 17:
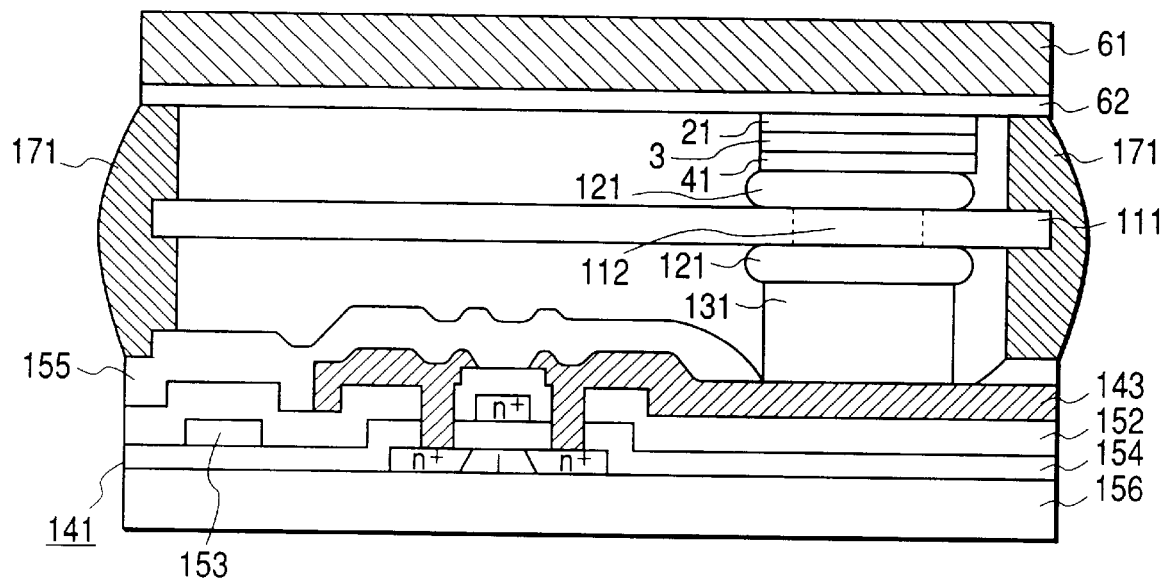
FIG. 17 is a sectional view of an EL apparatus for active matrix drive produced in the present invention.

FIG. 17 is a sectional view of an EL apparatus using the TFTs produced in this example.

The EL apparatus for active matrix drive produced in this example was driven for display and achieved the display of moving picture based on continuous light emission of 80 or more $cd/m^2$ over the period of 20 or more days.

EXAMPLE 6

Figure 18:
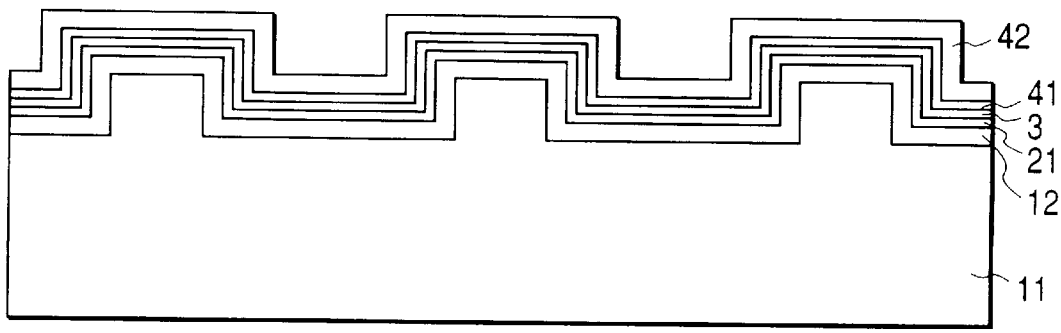
FIG. 18 is a sectional view to illustrate another state where a transparent electroconductive film is deposited on another example of the EL film illustrated in FIG. 3.

An insulating film 42 such as $SiO_2$ film, $Si_3N_4$ film, or $TiO_2$ film was further deposited as illustrated in FIG. 18 on the transparent electroconductive film 41 shown in FIG. 4, used in Example 1, by the film-forming technology such as sputtering.

Figure 19:
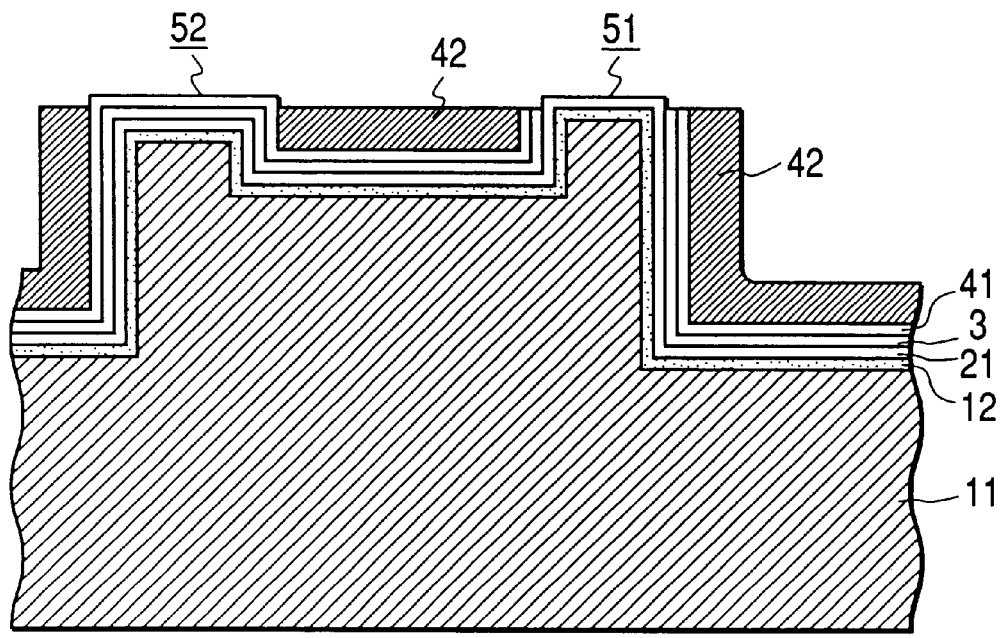
FIG. 19 is a detailed sectional view of a projecting portion in the example illustrated in FIG. 18.

FIG. 19 illustrates the detailed structure of a projecting portion shown in FIG. 18 and shows a state in which an exposed portion 51 of the transparent electroconductive film 12 and an exposed portion 52 of the transparent electroconductive film 41 are formed by polishing the surface of the projection after provision of the insulating film 42 shown in FIG. 18 and flattening the surface thereof.

The surface of a projection of the single-crystal Si substrate 11 corresponding to the exposed portions 51 and 52 is also preferably provided with small projecting portions having respectively predetermined heights. The predetermined heights are suitably set so that the height of the projecting portion corresponding to the exposed portion 51 is higher than the height of the projecting portion corresponding to the exposed portion 52 by a height equal to the total of the thickness of the EL layer 3 and the thickness of the transparent electroconductive film 41.

The above polishing can be conducted by a planarization process normally used in the ordinary lens polishing step or polishing step of semiconductor device.

In the method of the present invention the next step is producing the same single-crystal Si substrate 71 as the single-crystal Si substrate 11 shown in FIG. 19. A pair of electrodes used in the single-crystal Si substrate 71 are suitably determined as follows; one electrode is a reflective metal film 73 on the porous Si film 72 side, and the other electrode is a transparent electroconductive film 75 outside.

Porous Si film 72, EL layer 74, insulating film 76, and exposed portions 77 and 78 are formed by repeating the same method as described above. A suitable material for the reflective metal film 73 described above is an alloy of Ag and Mg.

The single-crystal Si substrates 11 and 71 are located opposite to each other so that the exposed portions 51, 77 and the exposed portions 52, 78, respectively, are electrically connected with each other, and they are overlaid on each other. If on this occasion the insulating films 42 and 76 of the single-crystal Si substrates 11 and 71 are processed by the corona discharge process to produce electric charge with one positive and the other negative, connection between the two substrates 11 and 71 will be further enhanced by electrostatic bond 79.

Figure 21:
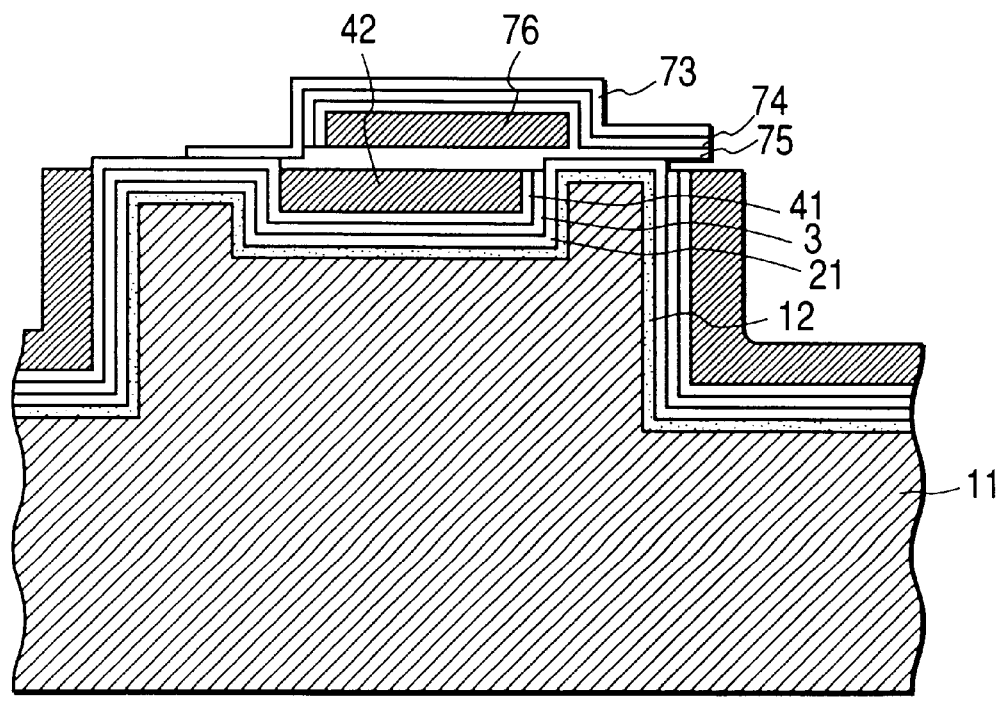
FIG. 21 is a sectional view to show a single-crystal silicon substrate and an EL device of the tandem structure thereon in one step in another production method of the present invention.
Figure 20:
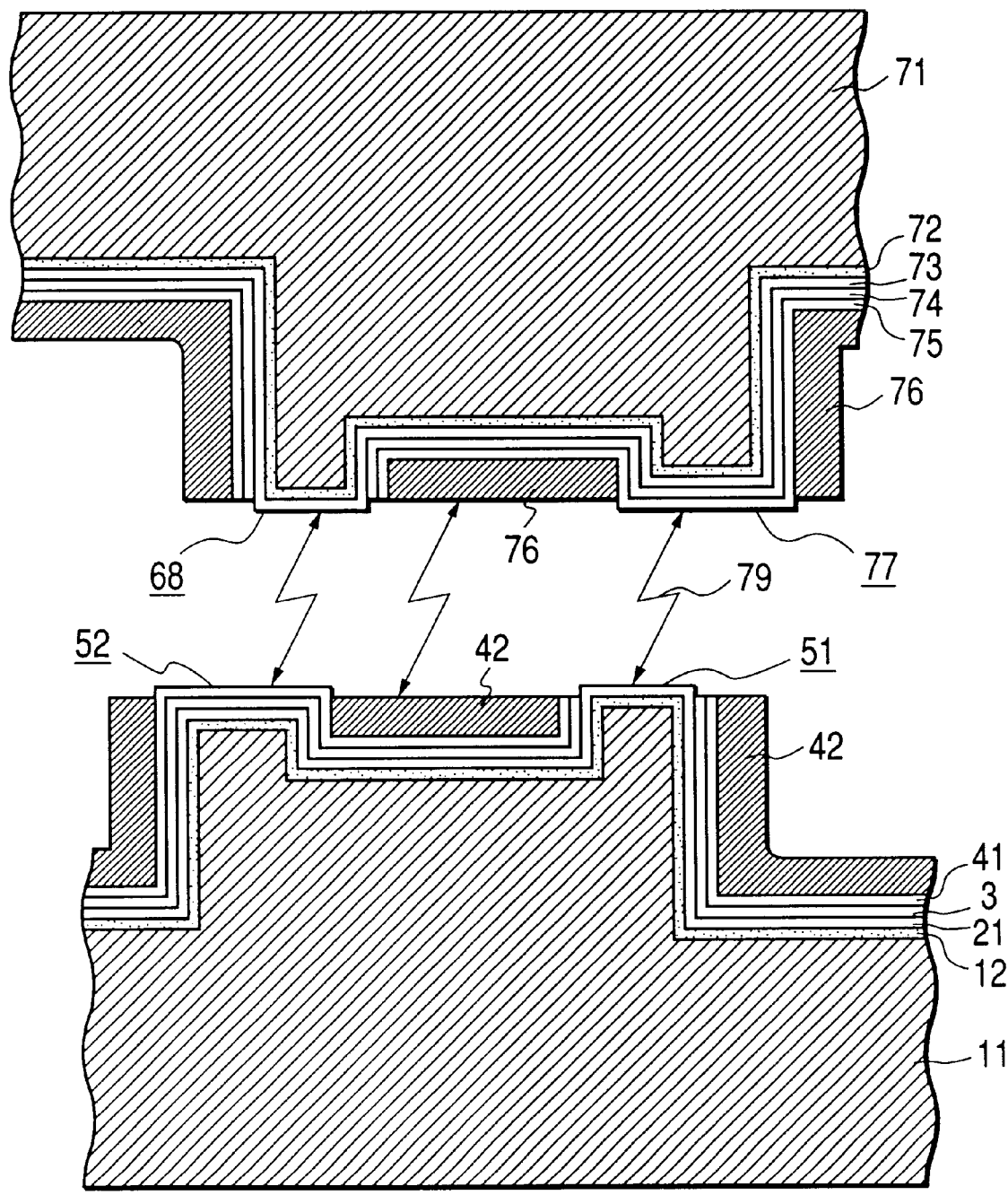
FIG. 20 is a sectional view to show a bonding state of two single-crystal silicon substrates in one step in another production method of the present invention.

FIG. 21 illustrates the structure achieved after the single-crystal Si substrate 71 was peeled through the porous Si film 72 from the state of the overlaid single-crystal Si substrates 11 and 71 illustrated in FIG. 20. In the structure illustrated in FIG. 21, the two independent EL layers 3 and 74 are electrically in series connection and compose the laminate structure. Therefore, the anodes of the EL layers 3 and 74 can be the transparent electroconductive film 21 and transparent electroconductive film 75 while the cathodes can be the transparent conductive film 41 and reflective metal film 73; and vice versa.

Then the bonded substrate 51 shown in FIG. 5 was held in the dry nitrogen chamber. In this case, the substrate 51 had the stripes of electrode layer 52 of a metal (silver, aluminum, gold, platinum, copper, or the like), preliminarily placed in correspondence to the positions of the projections produced as described above, and the adhesive electric connection members 53, which were of a thermosetting electroconductive adhesive or an ultraviolet or electron beam curable electroconductive adhesive, were further arranged at the same pitch as that of the projections described above, on the respective stripes of metal electrode layer 52.

Then the single-crystal Si substrate 11 produced in FIG. 21 was transferred from the vacuum chamber into the dry nitrogen chamber in which the above-stated bonded substrate 51 was set, and was held at a predetermined position in the dry nitrogen chamber.

Then the substrate 11 was fixed on the arm preliminarily mounted in the dry nitrogen chamber, and the arm was moved up to the position to face the bonded substrate 51 produced in FIG. 5 so that the reflective metal films 73 on the single-crystal Si substrate 11 of FIG. 21 were located opposite to the adhesive electric connection members 53 on the bonded substrate 51. Then the Si substrate 11 and the bonded substrate 51 were overlaid in a close fit on each other.

Then adhesion between the two substrates 11 and 51 was achieved through the adhesive electric connection members 53 under predetermined conditions (by application of heat or by exposure to ultraviolet rays or an electron beam).

Figure 22:
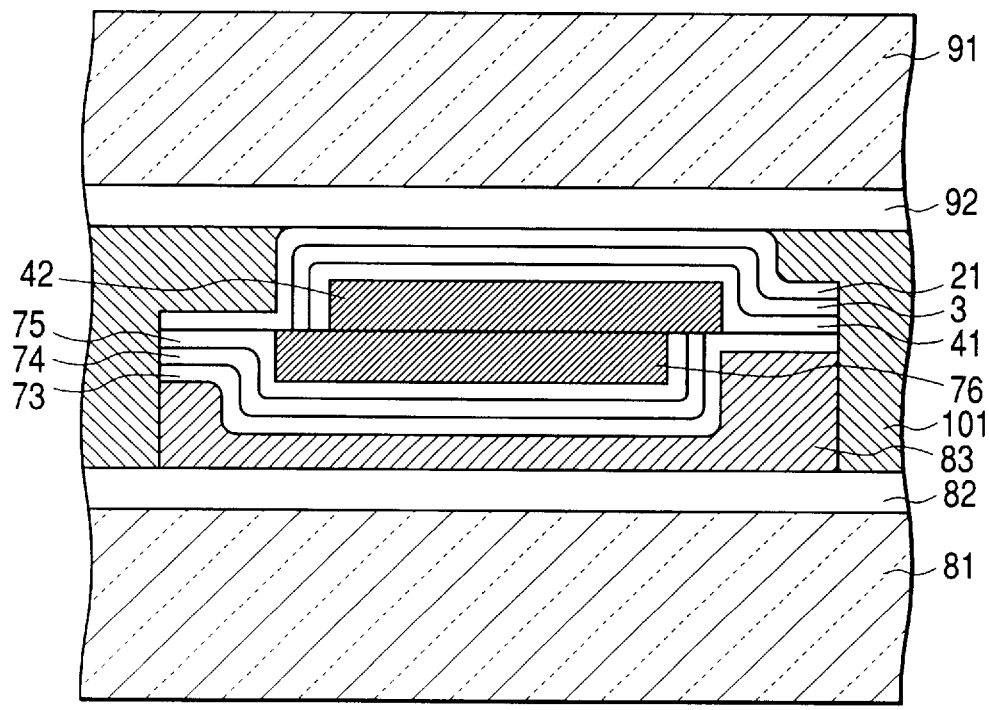
FIG. 22 is a sectional view of an EL device using the tandem structure of the present invention.

Then stresses were imparted on the both substrates 11 and 51 in parallel to each other so as to peel the two bonded substrates 11 and 51 from each other at the border of the porous Si film 12. As a result, the two substrates 11 and 51 were peeled from each other through the porous Si film 12, so that EL devices of the tandem structure, in which the first EL device comprised of the reflective metal films 73, the EL layer 74, and the transparent electroconductive film 75, and the second EL device comprised of the transparent electroconductive films 21, 41 and the EL layer 3 were connected in series, were transferred onto the adhesive electric connection members 53 on the side of the bonded substrate 51, as shown in FIG. 22. On this occasion, it is preferred to perform such a pre-operation as to facilitate the peeling step, for example, by driving a wedge into the porous Si film 12 before the peeling.

Thereafter, the bonded substrate 51 after the peeling was carried into the mechanical polishing chamber filled with dry nitrogen, and the porous Si film remaining on the reflective metal films 73 after the peeling was removed by the mechanical polishing machine with polishing cloth on the pad.

Then another opposite bonded substrate 61 illustrated in FIG. 6 was set in the dry nitrogen chamber. This opposite bonded substrate 61 was preliminarily provided with such stripes of ITO film 62 as to intersect with the longitudinal direction of the stripes of the aforementioned striped metal films 52, at positions where the positions of the polished, transparent electroconductive films 21 on the bonded substrate 51 after the peeling were opposed.

Further, an epoxy-based adhesive or a phenol-based adhesive as a sealing adhesive was preliminarily applied around the opposite bonded substrate 61 by the screen printing method or the dispenser applying method.

The bonded substrate 51 provided with the EL devices of the tandem structure, produced in the previous step, was carried into this dry nitrogen chamber, and the two bonded substrates 51 and 61 were overlaid on each other by the predetermined arm operation so that the stripes of ITO films 62 were opposed to the transparent electrode ITO films 21 transferred on the bonded substrate 51. Then the two substrates 51 and 61 were kept under heat and pressure to be sealed and bonded by the sealing adhesive.

FIG. 22 is a sectional view of a device of the present invention produced through the process described above. Numeral 101 in FIG. 22 designates the sealing adhesive described above.

The EL apparatus for passive matrix drive produced in this way was driven by the driving device shown in FIG. 7 to FIG. 10, and presented good EL emission display of moving picture over the long period of 20 or more days, based on the high-luminance light emission of 200 or more $cd/m^2$.

Figure 7:
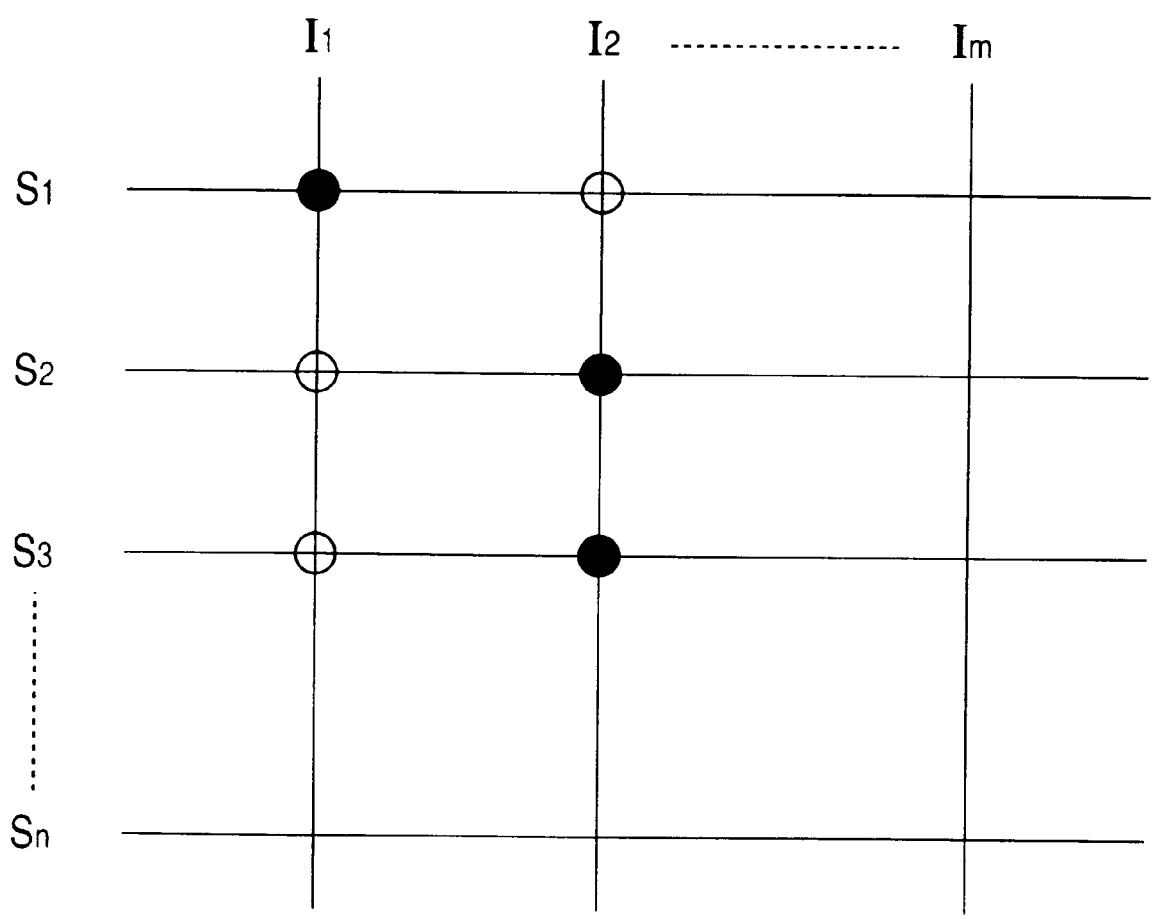
FIG. 7 is a block diagram of an EL apparatus for passive matrix used in the present invention.
Figure 8:
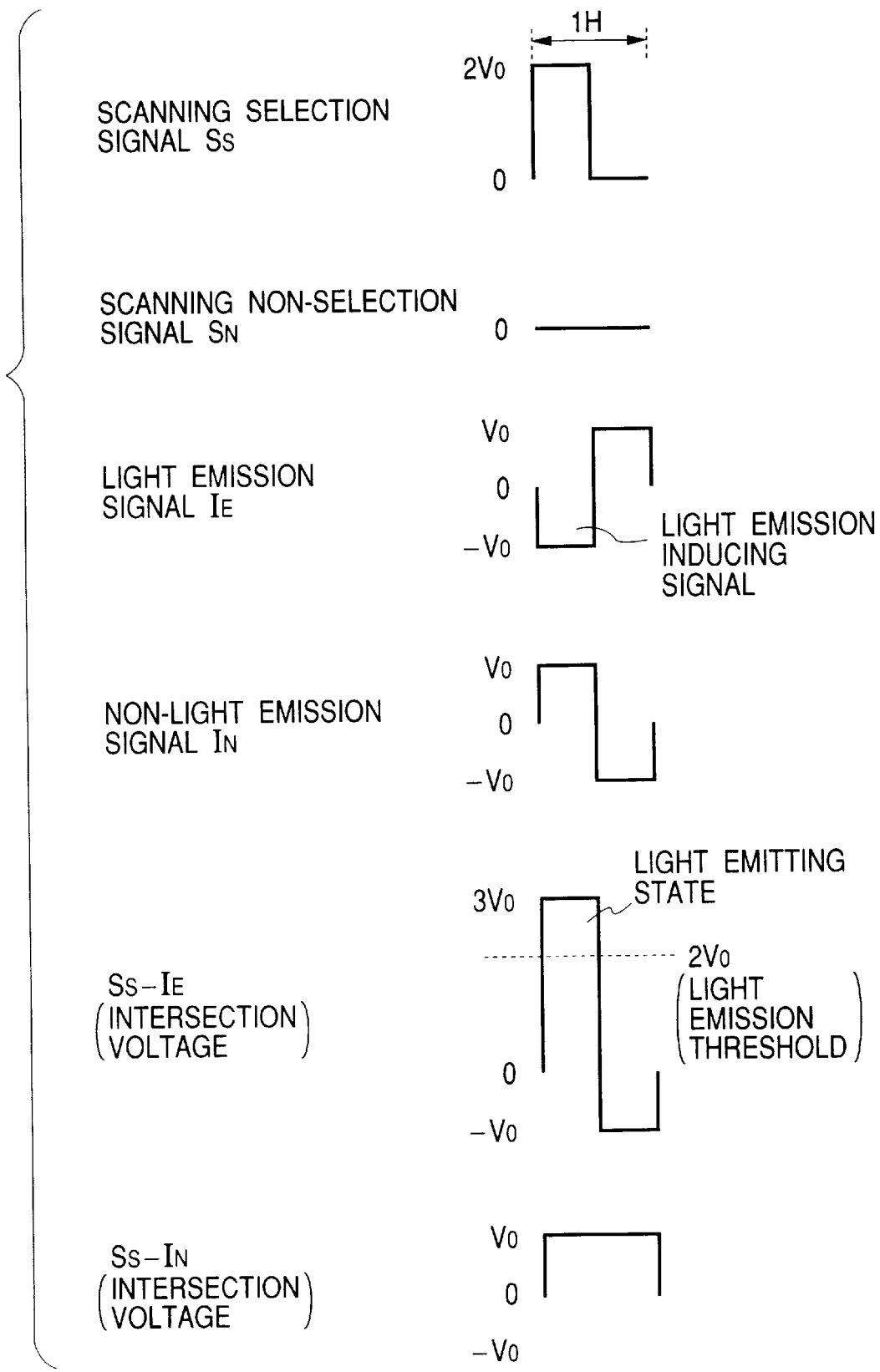
FIG. 8 is a driving waveform diagram to show voltage waveforms for passive matrix drive used in the present invention.

FIG. 8 shows voltage waveforms of a scanning selection signal and a scanning non-selection signal applied to the scanning signal lines in one horizontal scanning period (1H), and a light emission signal and a non-light-emission signal applied to the information signal lines. The first phase of the scanning selection signal is set to voltage $2V_0$ and the second phase thereof to voltage 0. In this case, the first-phase voltage may be over the voltage $2V_0$. The scanning non-selection signal is set to the voltage 0 in the first phase and the second phase. In this case, a DC component may be added to the voltage 0 in the forward bias direction or in the reverse bias direction. It may also be contemplated that the first-phase voltage is set to the voltage 0 while the second-phase voltage to the voltage $2V_0$. In this case, the light emission signals of FIG. 7 function as non-light-emission signals while the non-light-emission signals as light emission signals.

In the light emission signal a light emission inducing signal of voltage $-V_0$ is set in synchronism with the pulse of voltage $2V_0$ of the first phase in the scanning selection signal, so that the voltage $3V_0$, which is greater than the light emission threshold voltage $2V_0$ in the forward bias direction, is applied to the EL device, thereby producing the light emission state. Further, the light emission signal also includes the voltage $V_0$ applied in synchronism with the voltage 0 of the second phase in the scanning selection signal, so that the voltage $-V_0$ is applied to the EL device on this occasion, thereby producing the non-light-emission state.

When the non-light-emission signal is applied in synchronism with the first-phase voltage and the second-phase voltage of the scanning selection signal, the voltage $V_0$ is applied in either case, thus producing the non-light-emission state.

On the other hand, during application of the scanning non-selection signal (i.e., during a non-selecting period), the EL device receives either the light emission signal or the non-light-emission signal through the information signal line, so that AC voltage, created by the voltage $V_0$ and voltage $-V_0$ forming the light emission signal and the non-light-emission signal, is applied thereto.

Figure 9:
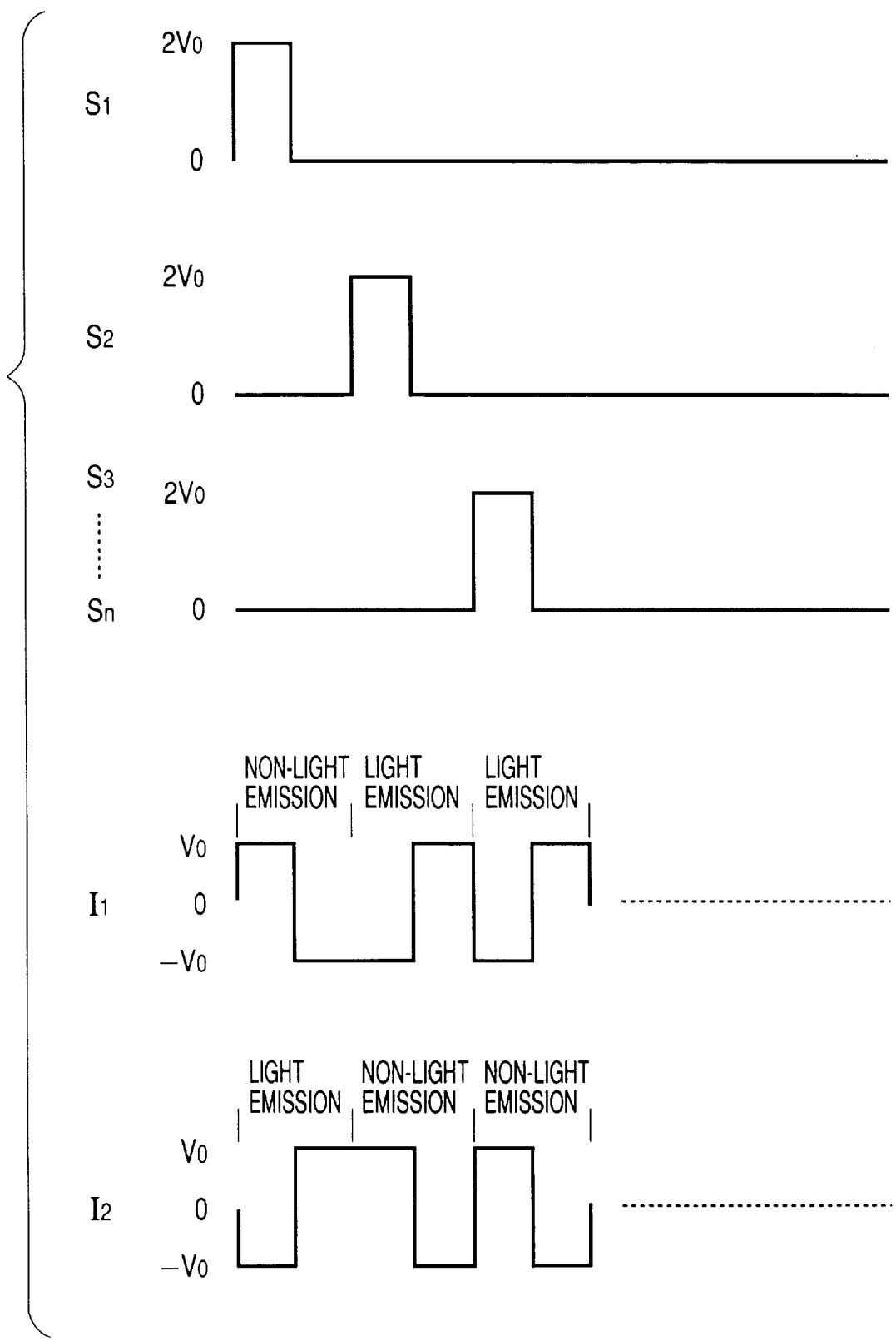
FIG. 9 is a voltage waveform diagram to show timing charts of the respective signals used in FIG. 8.
Figure 10:
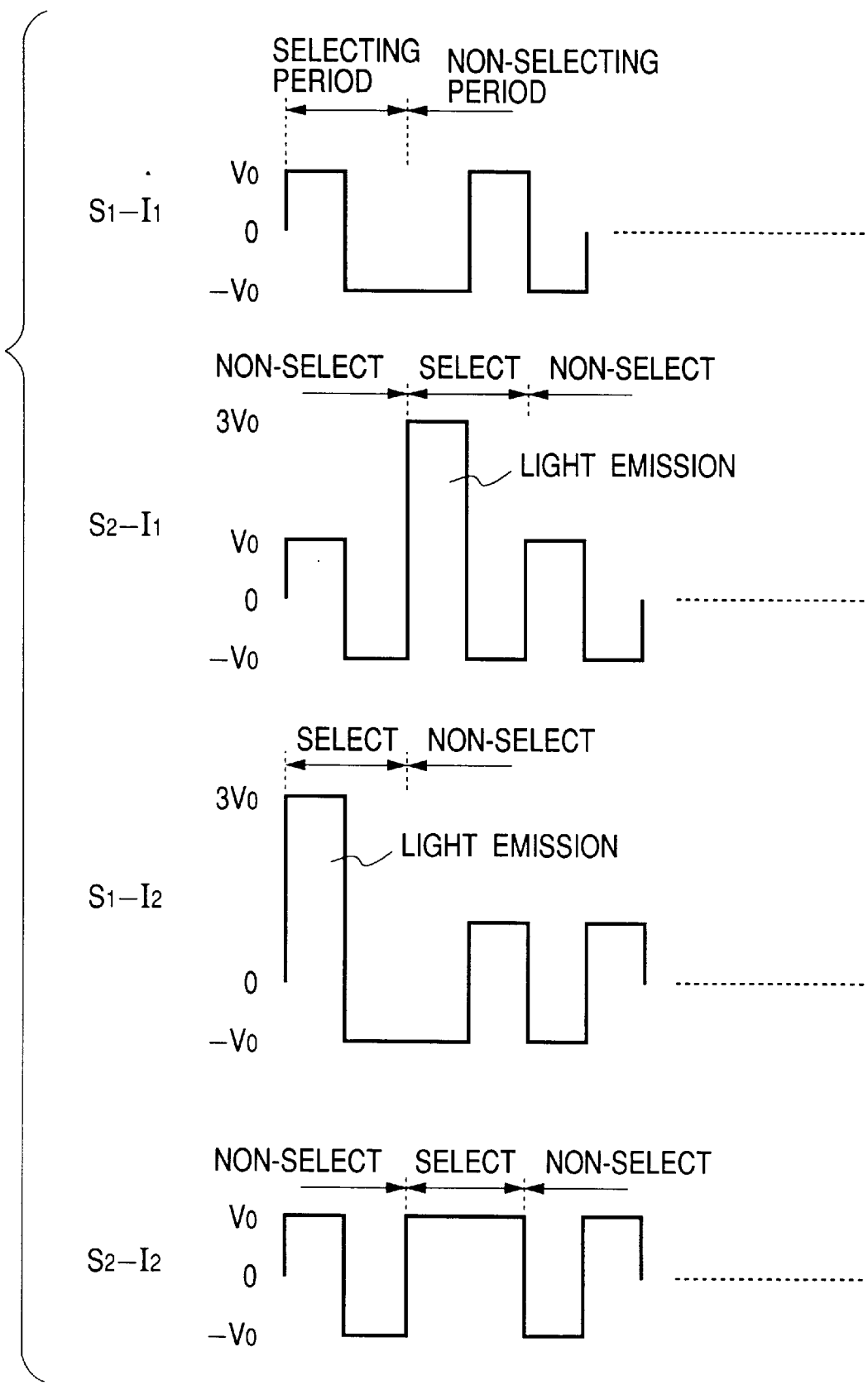
FIG. 10 is a voltage waveform diagram to show timing charts of driving waveforms for the respective pixels, used in FIG. 8.

FIG. 9 is a timing chart to show the scanning selection signals for generation of the light emission states illustrated in FIG. 7, and the light emission signals and non-light-emission signals. FIG. 10 is a timing chart of voltages applied to the EL device at each intersection in this case, which illustrates states in which the AC voltage, which is below the threshold voltage, is applied to the EL devices during the non-selecting periods.

EXAMPLE 7

An EL apparatus for passive matrix drive was produced by the same method as in Example 6 except that a single-crystal Si substrate with a smooth surface replaced the single-crystal Si substrate with the uneven surface used in Example 6 and that the porous film was formed by placing a mask covering only the positions corresponding to the depressions during the anodization for formation of porous Si film and anodizing only the positions corresponding to the projections.

The apparatus produced in this example achieved continuous high-luminance emission over the period of 20 or more days to show good EL emission display of moving picture.

EXAMPLE 8

An EL apparatus for passive matrix drive was produced according to the same method as in Example 6 except that the single-crystal Si substrate used in Example 6 was replaced by a substrate in which a polycrystal Si film was formed on an insulating film of $SiO_2$ on a surface of a single-crystal Si substrate.

The apparatus produced in this example showed good EL emission display of moving picture based on continuous high-luminance emission over the period of 20 or more days.

EXAMPLE 9

An EL apparatus for passive matrix drive provided with three-primary color emitting EL devices, REL, GEL, and BEL, was produced by setting the pitch of the projections of the uneven single-crystal Si substrate used in Example 6 three times longer, and repeating the steps of Example 6 three times, using the EL material for emission of red light (REL), the EL material for emission of green light (GEL), and the EL material for emission of blue light (BEL).

The apparatus produced in this example was driven to show display of moving picture by full-color EL emission, and it achieved continuous high-luminance display over the period of 20 or more days.

EXAMPLE 10

The same substrate as the single-crystal Si substrate illustrated in FIG. 21 in Example 6 was produced and was carried into the dry nitrogen chamber by the arm. The bonded substrate 111 illustrated in FIG. 11 was preliminarily set in the chamber.

This bonded substrate 111 had the through holes 112 at the positions corresponding to the projections of the single-crystal Si substrate. Each of these through holes 112 was charged with the electrically conductive paste agent 121, which became the adhesive electric connection members, in a heap as illustrated in FIG. 12 on the top and bottom sides.

Figure 11:
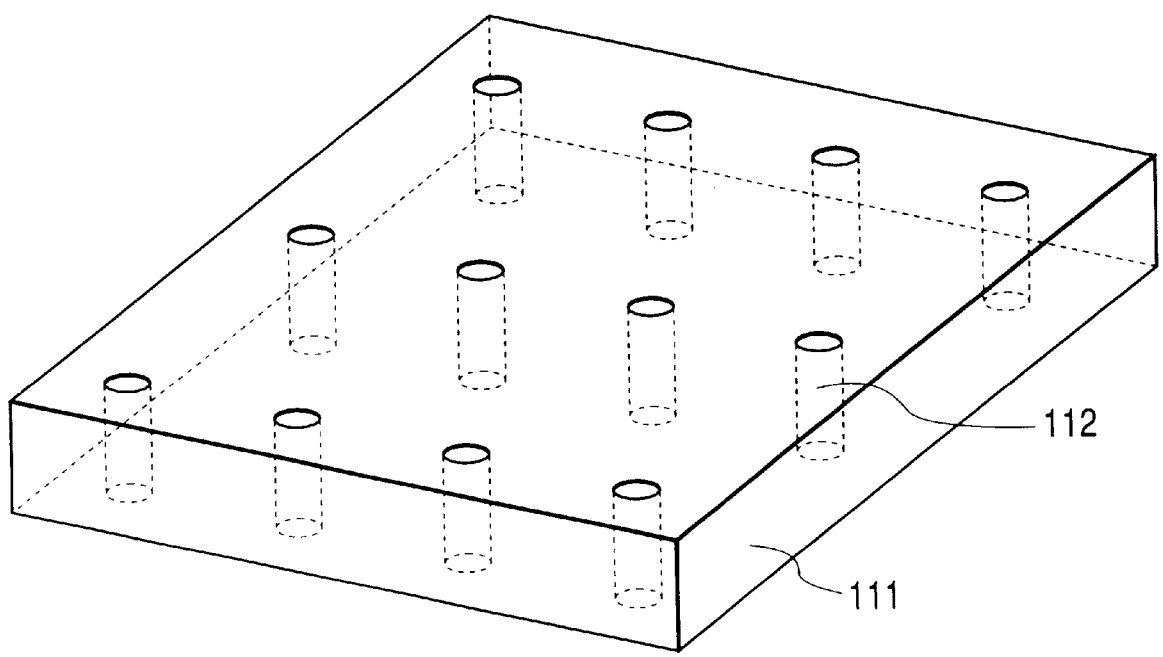
FIG. 11 is a perspective view to illustrate another example of the bonded substrate used in the present invention.

This bonded substrate 111 was overlaid on the single-crystal Si substrate illustrated in FIG. 11 so that the conductive paste heaps 121 and the reflective metal films 73 were opposed to each other, and the two substrates were kept under pressure and heat.

Then the bonded substrate 111 was peeled off through the porous Si film 12 on the single-crystal Si substrate 11, thereby transferring the EL devices of the serially connected tandem structure composed of the first EL device of the transparent electroconductive film 21, EL layer 3, and transparent electroconductive film 41, and the second EL device of the reflective metal film 73, EL layer 74, and transparent electroconductive film 75, onto the side of the bonded substrate 111.

Then an adhesive electric connection member 121 (conductive paste agent) was placed on each drain electrode pad in the TFT substrate of FIG. 13 to FIG. 16 mounted in the same dry nitrogen chamber. The bonded substrate 111 and TFT substrate were overlaid on each other so that the adhesive electric connection members 121 on this TFT substrate and the conductive paste heaps 121 on the bottom surface 122 of the aforementioned bonded substrate 111 were opposed to each other, and the two substrates were kept under pressure and heat, thereby fixing the two substrates through the conductive electric connection members 121.

Then the same substrate as the bonded substrate 61 illustrated in FIG. 6 was also set in the same chamber. Sealing adhesive 211 was applied around this bonded substrate 61, and the two substrates were overlaid on each other so that the striped ITO film 62 on this bonded substrate 61 and the transparent electroconductive film 21 of the tandem structure transferred to the top surface 123 side of the bonded substrate 111 bonded to the TFT substrate were opposed to each other. Then the two substrates were kept under pressure and heat to be fixed and sealed (with the sealing adhesive 211).

Figure 23:
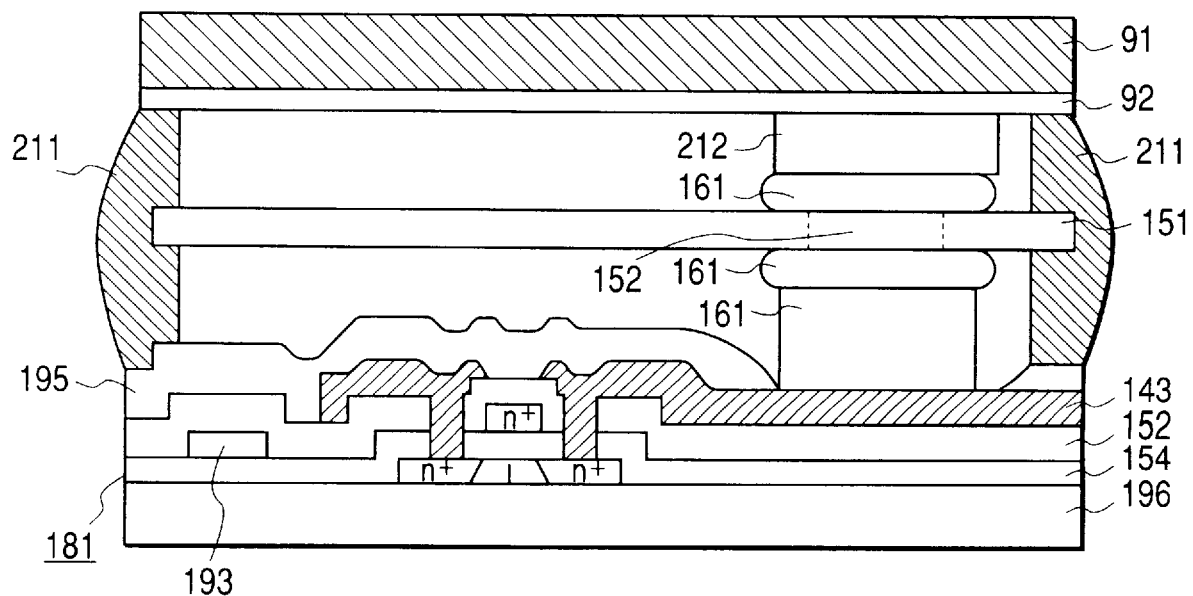
FIG. 23 is a sectional view of another EL apparatus for active matrix drive produced in the present invention.

FIG. 23 is a sectional view of the EL apparatus using the TFTs produced in this example. Numeral 212 in the drawing denotes the EL device of the tandem structure described above.

The EL apparatus for active matrix drive produced in the present example was driven for display and realized display of moving picture based on continuous light emission of 200 or more $cd/m^2$ over the long period of 20 or more days.

Materials applicable as the organic EL materials in the present invention are those disclosed, for example, in Scozzafava's EPA 349,265 (1990); Tang's U.S. Pat. No. 4,356,429; VanSlyke et al.'s U.S. Pat. No. 4,539,507; VanSlyke et al.'s U.S. Pat. No. 4,720,432; Tang et al.'s U.S. Pat. No. 4,769,292; Tang et al.'s U.S. Pat. No. 4,885,211; Perry et al.'s U.S. Pat. No. 4,950,950; Littman et al.'s U.S. Pat. No. 5,059,861; VanSlyke's U.S. Pat. No. 5,047,687; Scozzafava et al.'s U.S. Pat. No. 5,073,446; VanSlyke et al.'s U.S. Pat. No. 5,059,862; VanSlyke et al.'s U.S. Pat. No. 5,061,617; VanSlyke's U.S. Pat. No. 5,151,629; Tang et al.'s U.S. Pat. No. 5,294,869; Tang et al.'s U.S. Pat. No. 5,294,870. The EL layer is comprised of an organic hole injection and migration zone in contact with the anode, and an electron injection and migration zone which forms a junction with the organic hole injection and migration zone. The hole injection and migration zone can be made of a single material or plural materials and is comprised of the anode, a continuous hole migration layer interposed between a hole injection layer and the electron injection and migration zone, and the hole injection layer in contact therewith. Similarly, the electron injection and migration zone can be made of a single material or plural materials and is comprised of the cathode, a continuous electron migration layer interposed between an electron injection layer and the hole injection and migration zone, and the electron injection layer in contact therewith. Recombination of hole and electron and luminescence occurs in the electron injection and migration zone adjacent to the junction between the electron injection and migration zone and the hole injection and migration zone. Compounds forming the organic EL layer are deposited typically by vapor deposition, but they may also be deposited by other conventional technologies.

In a preferred embodiment the organic material of the hole injection layer has the general formula below.

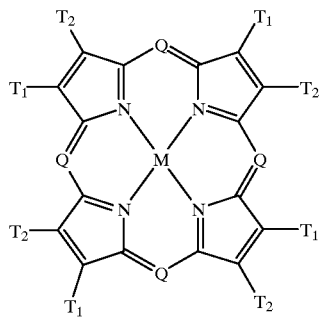

In the above formula, Q represents N or C–R (where R is alkyl such as methyl, ethyl, or propyl, or hydrogen), M is a metal, a metal oxide, or a metal halide, and T1, T2 represent hydrogen or both make up an unsaturated six-membered ring containing a substituent such as alkyl or halogen. A preferred alkyl part contains approximately one to six carbon atoms, while phenyl composes a preferred aryl part.

In a preferred embodiment the hole migration layer is aromatic tertiary amine. A preferred subclass of the aromatic tertiary amine contains tetraaryldiamine having the following formula.

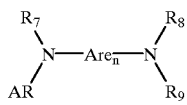

In the above formula Are represents arylene, n an integer from 1 to 4, and Ar, $R_7$, $R_8$, $R_9$ each an aryl group selected. In a preferred embodiment the luminescence, electron injection and migration zone contains a metal oxinoid compound. A preferred example of the metal oxinoid compound has the general formula below.

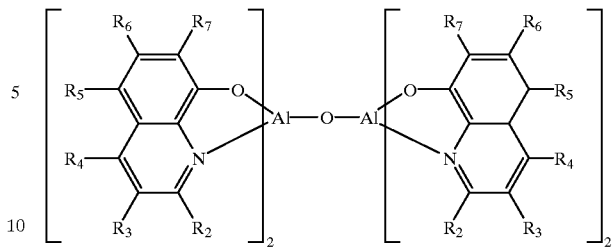

In this formula $R_2$–$R_7$ represent substituent. In another preferred embodiment the metal oxinoid compound has the following formula.

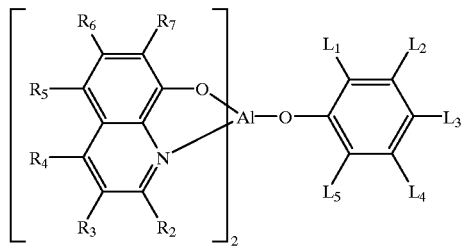

In the above formula $R_2$–$R_7$ are those defined above, and L1–L5 intensively contain 12 or less carbon atoms, each separately representing hydrogen or a carbohydrate group of 1 to 12 carbon atoms, wherein L1, L2 together, or L2, L3 together can form a united benzo ring. In another preferred embodiment the metal oxinoid compound has the following formula.

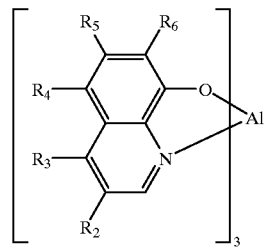

In this formula $R_2$–$R_6$ represent hydrogen or other substituent. The above examples only represent some preferred organic materials simply used in the electroluminescence layer. Those are not described herein for the intention of limiting the scope of the present invention, but generally indicate the organic electroluminescence layer. As understood from the above examples, the organic EL materials include the coordinate compounds having the organic ligand.

The EL devices used in the present invention may be the other EL devices than the EL devices described above, and the organic EL devices are particularly preferred. In particular, the EL devices are those composing the REL, GEL, and BEL devices.

Specific examples of the REL, GEL, and BEL materials were listed above, but it should be noted that the present invention is by no means limited to these examples, but the inorganic EL materials can also be applied instead of the organic EL materials.

The present invention made it possible to continuously produce the EL apparatus for passive matrix drive, and the EL apparatus for active matrix drive using the TFTs without exposure to the atmosphere, thereby achieving continuous high-luminance light emission over the long period.

The present invention made it possible to form the organic electroluminescence devices for emitting the three primary colors on a single substrate in vacuum, in a reduced-pressure space, or in a dry nitrogen atmosphere without exposure to the atmosphere, thereby providing the electroluminescence devices realizing the continuous, stable, high-luminance light emission over the long period.

What is claimed is:

1. An electroluminescence device comprising:
   a first electroluminescence member having a first anode, a first cathode, and a first electroluminescence material interposed between said first anode and first cathode; and a second electroluminescence member having a second anode overlaid on said first electroluminescence member, a second cathode, and a second electroluminescence material interposed between said second anode and second cathode, wherein said first anode and second anode are connected to each other and wherein said first cathode and second cathode are connected to each other.

2. The electroluminescence device according to claim 1, wherein each of said first and second electroluminescence materials is an inorganic electroluminescence material or an organic electroluminescence material.

3. The electroluminescence device according to claim 1, wherein said first and second electroluminescence materials are both organic electroluminescence materials.

4. The electroluminescence device according to claim 1, wherein said first and second electroluminescence materials are both inorganic electroluminescence materials.

5. The electroluminescence device according to claim 1, wherein said first and second electroluminescence materials are both electroluminescence materials of the same color.

6. The electroluminescence device according to claim 1, wherein said first and second electroluminescence materials are both electroluminescence materials of the same color and emit light of one color out of red, green, and blue.

7. The electroluminescence device according to claim 1, wherein said first anode is insulated from said second cathode.

8. The electroluminescence device according to claim 1, wherein said first cathode is insulated from said second anode.

9. The electroluminescence device according to claim 1, wherein one of said first anode, first cathode, second anode, and second cathode is made of a reflective metal and the others are made of a transparent electroconductive material.

10. An electroluminescence device comprising:
    a first electroluminescence member having a first electrode, a first electroluminescence material connected to the first electrode, and a second electrode connected to the first electroluminescence material; and a second electroluminescence member having a third electrode overlaid on the second electrode of the first electroluminescence member with an insulating layer in between, a second electroluminescence material connected to the third electrode, and a fourth electrode connected to the second electroluminescence material, wherein the first electrode and the third electrode are connected to each other and the second electrode and the fourth electrode are connected to each other, and wherein the first electrode and the fourth electrode are insulated from each other and the second electrode and the third electrode are insulated from each other.

11. The electroluminescence device according to claim 10, wherein said first electrode and third electrode are set as anodes and said second electrode and fourth electrode as cathodes.

12. The electroluminescence device according to claim 10, wherein said first electrode and third electrode are set as cathodes and said second electrode and fourth electrode as anodes.

13. The electroluminescence device according to claim 10, wherein said first electrode is made of a reflective metal and said second electrode, third electrode, and fourth electrode are made of a transparent electroconductive material.

14. The electroluminescence device according to claim 10, wherein each of said first and second electroluminescence materials is an inorganic electroluminescence material or an organic electroluminescence material.

15. The electroluminescence device according to claim 10, wherein said first and second electroluminescence materials are both organic electroluminescence materials.

16. The electroluminescence device according to claim 10, wherein said first and second electroluminescence materials are both inorganic electroluminescence materials.

17. As An electroluminescence apparatus comprising electroluminescence devices arranged along plural rows and plural columns, each said electroluminescence device comprising a first electroluminescence member having a first electrode, a first electroluminescence material connected to the first electrode, and a second electrode connected to the first electroluminescence material; and a second electroluminescence member having a third electrode overlaid on the second electrode of the first electroluminescence member with an insulating layer in between, a second electroluminescence material connected to the third electrode, and a fourth electrode connected to the second electroluminescence material, said electroluminescence devices having such a device structure that the first electrode and the third electrode are connected to each other and the second electrode and fourth electrode are connected to each other and that the first electrode and the fourth electrode are insulated from each other and the second electrode and the third electrode are insulated from each other, said electroluminescence apparatus comprising first wires, each first wire being a common wire for connecting the first electrodes of the electroluminescence devices on one of said rows, and first driving means for driving the first wires, said apparatus further comprising second wires, each second wire being a common wire for connecting the fourth electrodes of the electroluminescence devices on one of said columns, and second driving means for driving the second wires.

18. The electroluminescence apparatus according to claim 17, wherein said first driving means comprises means for applying a scanning signal to the first wires and said second driving means comprises means for applying an information signal according to information, to the second wires in synchronism with the scanning signal.

19. The electroluminescence apparatus according to claim 17, wherein said first electrode and third electrode are set as anodes and said second electrode and fourth electrode as cathodes.

20. The electroluminescence apparatus according to claim 17, wherein said first electrode and third electrode are set as cathodes and said second electrode and fourth electrode as anodes.

21. The electroluminescence apparatus according to claim 17, wherein said first electrode is made of a reflective metal and said second electrode, third electrode, and fourth electrode are made of a transparent electroconductive material.

22. The electroluminescence apparatus according to claim 17, wherein each of said first and second electroluminescence materials is an inorganic electroluminescence material or an organic electroluminescence material.

23. The electroluminescence apparatus according to claim 17, wherein said first and second electroluminescence materials are both organic electroluminescence materials.

24. The electroluminescence apparatus according to claim 17, wherein said first and second electroluminescence materials are both inorganic electroluminescence materials.

25. An electroluminescence apparatus comprising electroluminescence devices arranged along plural rows and plural columns, switching devices connected to the respective electroluminescence devices, gate wires, each gate wire being a common wire for connecting gates of switching devices on a row, and source wires, each source wire being a common wire for connecting sources of switching devices on a column, each said electroluminescence device comprising a first electroluminescence member having a first electrode, a first electroluminescence material connected to the first electrode, and a second electrode connected to the first electroluminescence material; and a second electroluminescence member having a third electrode overlaid on the second electrode of the first electroluminescence member with an insulating layer in between, a second electroluminescence material connected to the third electrode, and a fourth electrode connected to the second electroluminescence material, said electroluminescence devices having such a device structure that the first electrode and third electrode are connected to each other and the second electrode and the fourth electrode are connected to each other and that the first electrode and the fourth electrode are insulated from each other and the second electrode and the third electrode are insulated from each other, said electroluminescence apparatus further comprising a common wire for connecting the first electrode of the electroluminescence device to each drain of said switching device and for connecting the fourth electrodes of said electroluminescence devices in common.

26. The electroluminescence apparatus according to claim 25, wherein said common wire is a plurality of wires for connecting the fourth electrodes of the electroluminescence devices in common on each row.

27. The electroluminescence apparatus according to claim 25, wherein said first electrode and third electrode are set as anodes and said second electrode and fourth electrode as cathodes.

28. The electroluminescence apparatus according to claim 25, wherein said first electrode and third electrode are set as cathodes and said second electrode and fourth electrode as anodes.

29. The electroluminescence apparatus according to claim 25, wherein said first electrode is made of a reflective metal and said second electrode, third electrode, and fourth electrode are made of a transparent electroconductive material.

30. The electroluminescence apparatus according to claim 25, wherein each of said first and second electroluminescence materials is an inorganic electroluminescence material or an organic electroluminescence material.

31. The electroluminescence apparatus according to claim 25, wherein said first and second electroluminescence materials are both organic electroluminescence materials.

32. The electroluminescence apparatus according to claim 25, wherein said first and second electroluminescence materials are both inorganic electroluminescence materials.

* * * * *

UNITED STATES PATENT AND TRADEMARK OFFICE
CERTIFICATE OF CORRECTION

PATENT NO.    : 6,215,244 B1  
DATED         : April 10, 2001  
INVENTOR(S)   : Masaki Kuribayashi et al.

It is certified that error appears in the above-identified patent and that said Letters Patent is hereby corrected as shown below:

Column 1,
Line 26, "(catfode-ray tube)" should read -- (cathode-ray tube) --.

Column 18,
Line 25, "As" should be deleted.

Signed and Sealed this

Twenty-sixth Day of August, 2003

JAMES E. ROGAN
*Director of the United States Patent and Trademark Office*